United States Patent
Yeo et al.

(10) Patent No.: US 12,284,889 B2
(45) Date of Patent: Apr. 22, 2025

(54) DISPLAY APPARATUS

(71) Applicant: Samsung Display Co., Ltd., Yongin-si (KR)

(72) Inventors: Inhyuck Yeo, Yongin-si (KR); Jiryun Park, Yongin-si (KR); Seokje Seong, Yongin-si (KR); Hyeonwoo Shin, Yongin-si (KR); Seunghwan Cho, Yongin-si (KR); Wonsuk Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 439 days.

(21) Appl. No.: 17/731,217

(22) Filed: Apr. 27, 2022

(65) Prior Publication Data

US 2023/0047292 A1   Feb. 16, 2023

(30) Foreign Application Priority Data

Aug. 11, 2021   (KR) .................. 10-2021-0106177

(51) Int. Cl.
*H10K 59/131*   (2023.01)
*H10K 59/88*   (2023.01)

(52) U.S. Cl.
CPC .......... *H10K 59/131* (2023.02); *H10K 59/88* (2023.02)

(58) Field of Classification Search
CPC .. H10K 59/131; H10K 59/179; H10K 59/805; H10K 59/88; G09G 3/3275; G09G 3/3283; G09G 3/3291
See application file for complete search history.

(56) References Cited

U.S. PATENT DOCUMENTS

| | | | |
|---|---|---|---|
| 11,069,302 B2 | 7/2021 | Lee | |
| 2008/0128699 A1* | 6/2008 | Seong | G02F 1/1345 257/E27.111 |
| 2009/0096975 A1* | 4/2009 | Kwon | G02F 1/1345 349/139 |
| 2019/0019441 A1* | 1/2019 | Shin | H10K 71/70 |
| 2020/0258973 A1 | 8/2020 | Park et al. | |
| 2021/0296424 A1 | 9/2021 | Cho et al. | |
| 2022/0020839 A1 | 1/2022 | Cho et al. | |

FOREIGN PATENT DOCUMENTS

| | | |
|---|---|---|
| KR | 10-2018-0128555 | 12/2018 |
| KR | 10-2020-0017012 | 2/2020 |
| KR | 10-2020-0140440 | 12/2020 |
| KR | 10-2022-0011243 | 1/2022 |

* cited by examiner

*Primary Examiner* — Brook Kebede
(74) *Attorney, Agent, or Firm* — KILE PARK REED & HOUTTEMAN PLLC

(57) ABSTRACT

A display apparatus includes a substrate, a first data line, a second data line, and a bridge line. The substrate includes a display area and a peripheral area outside the display area. The first data line is disposed over the substrate and crosses the display area. The second data line is disposed over the substrate and is disposed in a first direction from the first data line. The second data line crosses the display area. The bridge line includes one end electrically connected to the second data line and crosses, on a different layer from a layer on which the first data line is disposed, the first data line in the display area. A length of the first data line is greater than a length of the second data line.

22 Claims, 23 Drawing Sheets

DISPLAY APPARATUS

CROSS-REFERENCE TO RELATED APPLICATIONS

This application claims priority to and the benefit of Korean Patent Application No. 10-2021-0106177, filed Aug. 11, 2021, which is hereby incorporated by reference for all purposes as if fully set forth herein.

BACKGROUND

Field

One or more embodiments generally relate to a display apparatus, and more particularly, to a display apparatus capable of displaying high-quality images.

DISCUSSION

Generally, in a display apparatus, such as an organic light-emitting display apparatus, thin-film transistors are arranged in each (sub)-pixel to control brightness and the like of each (sub)-pixel. The thin-film transistors control the brightness and the like of a corresponding (sub)-pixel according to a data signal and the like transferred thereto.

The above information disclosed in this section is only for understanding the background of the inventive concepts, and, therefore, may contain information that does not form prior art.

SUMMARY

Even when the same data signal is applied to (sub)-pixels of a conventional display apparatus, brightness may change in one or more columns of (sub)-pixels. As such, one or more embodiments provide a display apparatus capable of displaying high-quality images that eliminate (or at least reduce) such issues. It is noted, however, that such a technical issue is merely an example, and embodiments are not limited thereto.

Additional aspects will be set forth in the detailed description which follows, and, in part, will be apparent from the disclosure, or may be learned by practice of the inventive concepts.

According to one or more embodiments, a display apparatus includes a substrate, a first data line, a second data line, and a bridge line. The substrate includes a display area and a peripheral area outside the display area. The first data line is disposed over the substrate and crosses the display area. The second data line is disposed over the substrate and is disposed in a first direction from the first data line. The second data line crosses the display area. The bridge line includes one end electrically connected to the second data line and crosses, on a different layer from a layer on which the first data line is disposed, the first data line in the display area. A length of the first data line is greater than a length of the second data line.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings.

DETAILED DESCRIPTION OF SOME EMBODIMENTS

Figure 1:
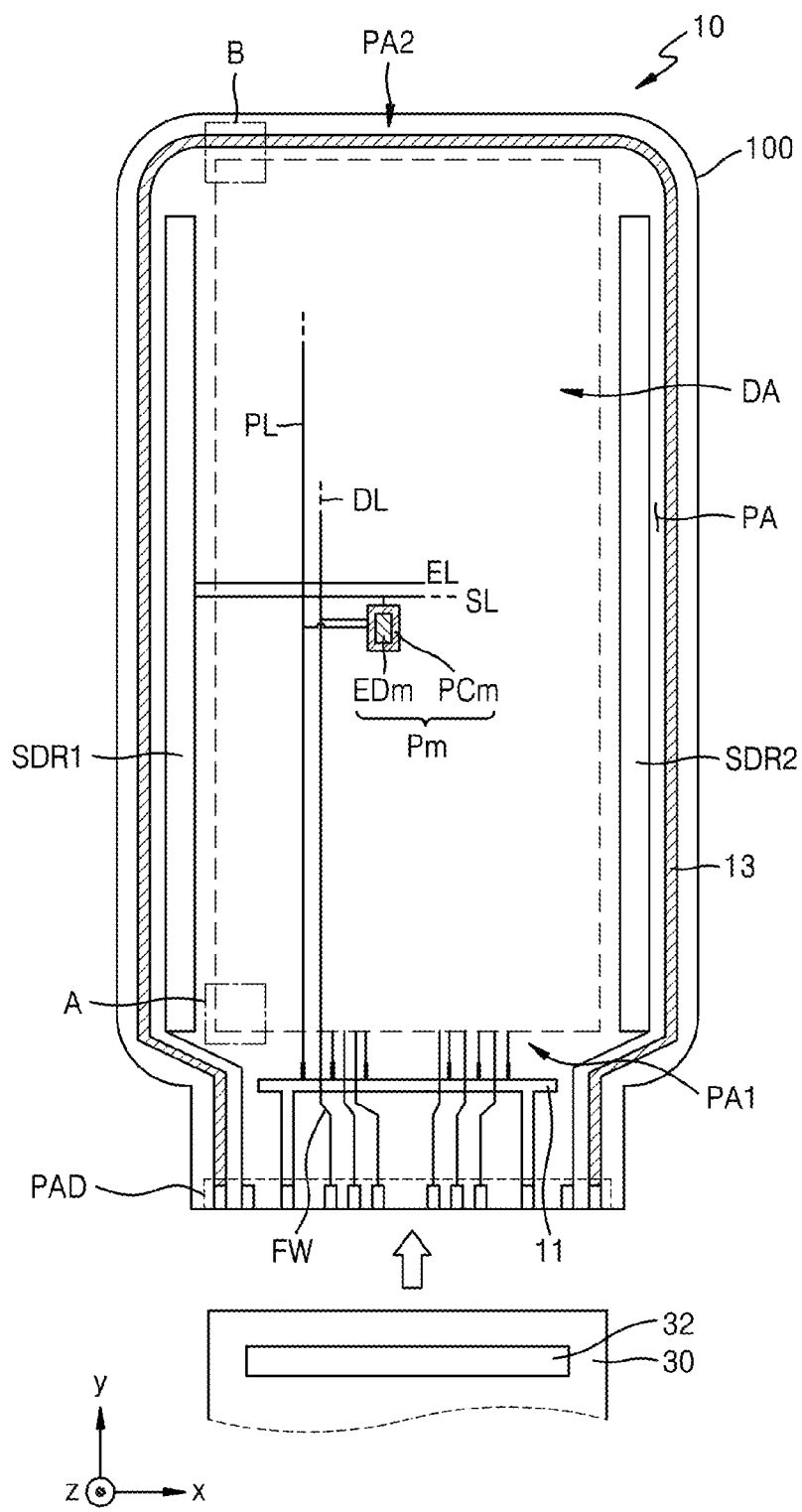
FIG. 1 is a schematic plan view of a portion of a display apparatus according to an embodiment.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

FIG. 1 is a schematic plan view of a portion of a display apparatus 10 according to an embodiment. As shown in FIG. 1, a substrate 100 of the display apparatus 10 includes a display area DA and a peripheral area PA outside the display area DA. The display area DA may be configured to display images. The peripheral area PA may be a kind of non-display area in which display elements are not arranged. The display area DA may be surrounded by (e.g., entirely surrounded by) the peripheral area PA.

The substrate 100 may include glass, metal, or a polymer resin. In the case where the substrate 100 is flexible or bendable, the substrate 100 may include, for example, a polymer resin including at least one of polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 may have a multi-layered structure including two layers and a barrier layer therebetween, the two layers including at least one of the above-noted polymer resins, and the barrier layer including an inorganic material (such as at least one of silicon oxide, silicon nitride, silicon oxynitride, and the like). However, various modifications may be made.

The display apparatus 10 may display images using a plurality of pixels Pm arranged in (or on) the display area DA of the substrate 100. The pixels Pm may each include a pixel circuit PCm and a display element EDm electrically connected thereto. The pixel circuit PCm may include at least one thin-film transistor TFT configured to control whether the display element EDm emits light and/or an emission degree, and the like. The pixel circuit PCm may overlap the display element EDm.

Hereinafter, an organic light-emitting display apparatus is described as an example of the display apparatus 10 according to an embodiment. In this manner, the case where the display element EDm is an organic light-emitting element is described. However, the display apparatus 10 according to various embodiments is not limited thereto. For instance, the display apparatus 10 according to an embodiment may be an inorganic light-emitting display apparatus, a quantum-dot light-emitting display apparatus, a micro-light-emitting display apparatus, etc. As an example, an emission layer of a display element of the display apparatus 10 may include an organic material, an inorganic material, and/or an organic material and quantum dots. In addition, the display apparatus 10 may include quantum dots to convert the wavelength of light.

The pixel circuit PCm of the pixel Pm in the display area DA may be electrically connected to outer circuits arranged in the peripheral area PA. A first scan driving circuit SDR1, a second scan driving circuit SDR2, a terminal part PAD, a driving voltage supply line 11, and a common voltage supply line 13 may be arranged in the peripheral area PA.

The first scan driving circuit SDR1 may be arranged on one side (e.g., a (−) x-direction) of the display area DA. The second scan driving circuit SDR2 may be arranged on one side (e.g., a (+) x-direction) of the display area DA. The second scan driving circuit SDR2 and the first scan driving circuit SDR1 may be arranged symmetric with each other around the display area DA. The first scan driving circuit SDR1 may be connected to some of the pixel circuits PCm through a scan line SL to apply a scan signal thereto. The second scan driving circuit SDR2 may be connected to the others of the pixel circuits PCm through a scan line (not shown) to apply a scan signal thereto. The first scan driving circuit SDR1 may be connected to some of the pixel circuits PCm through an emission control line EL to apply an emission control signal thereto. The second scan driving circuit SDR2 may be connected to the others of the pixel circuits PCm through an emission control line (not shown) to apply an emission control signal thereto.

The terminal part PAD may be arranged in a first peripheral area PA1, which is one side of the substrate 100. The terminal part PAD may be exposed and connected to a display circuit board 30. In this manner, the terminal part PAD may not be covered by an insulating layer. A display driver 32 may be arranged on the display circuit board 30.

The display driver 32 may generate control signals transferred to the first scan driving circuit SDR1 and the second scan driving circuit SDR2. In addition, the display driver 32 may generate a data signal and the generated data signal may be transferred to the pixel circuit PCm through a fan-out line FW and a data line DL connected to the fan-out line FW.

The display driver 32 may be configured to supply a driving voltage ELVDD to the driving voltage supply line 11 and supply a common voltage ELVSS to the common voltage supply line 13. The driving voltage ELVDD may be applied to the pixel circuit PCm through a driving voltage line PL connected to the driving voltage supply line 11. The common voltage ELVSS may be supplied to the common voltage supply line 13 and applied to an opposite electrode of the display element EDm.

The driving voltage supply line 11 may be arranged below the display area DA and may have a shape extending in an x-axis direction. The common voltage supply line 13 may have a loop shape having one open side to surround a portion of the display area DA.

Figure 2:
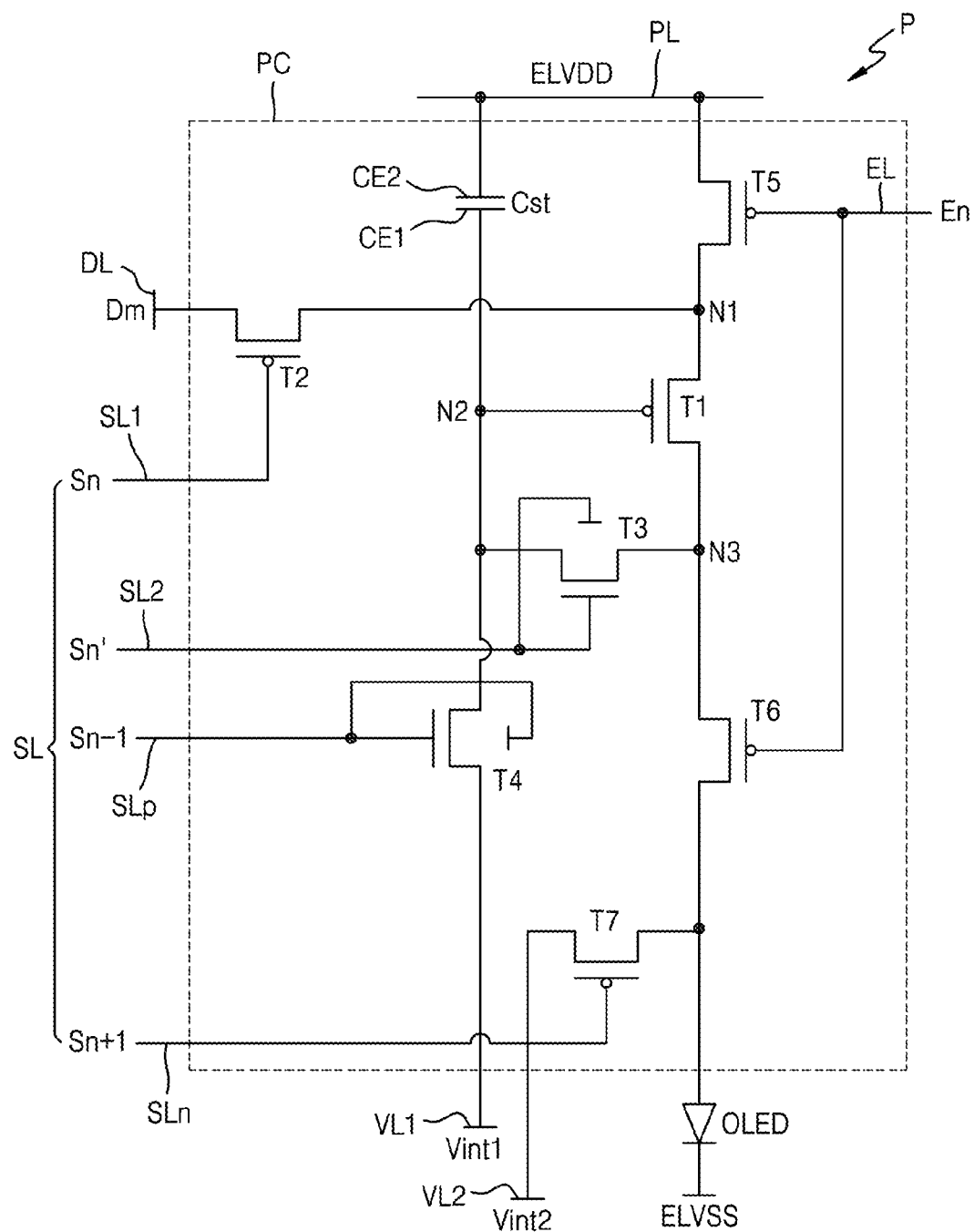
FIG. 2 is an equivalent circuit diagram of a pixel of a display apparatus according to an embodiment.

FIG. 2 is an equivalent circuit diagram of a pixel P of the display apparatus of FIG. 1 according to an embodiment. Here, the pixel P means a pixel denoted by a reference numeral Pm in FIG. 1.

As shown in FIG. 2, the pixel P may include a pixel circuit PC and an organic light-emitting diode OLED electrically connected thereto. The pixel circuit PC means a pixel circuit denoted by a reference numeral PCm in FIG. 1, and the organic light-emitting diode OLED means a display element denoted by a reference numeral EDm in FIG. 1.

As shown in FIG. 2, the pixel circuit PC may include a plurality of thin-film transistors T1, T2, T3, T4, T5, T6, and T7 and a storage capacitor Cst. The plurality of thin-film transistors T1, T2, T3, T4, T5, T6, and T7 and the storage capacitor Cst may be connected to signal lines SL1, SL2, SLp, SLn, EL, and DL, a first initialization voltage line VL1, a second initialization voltage line VL2, and the driving voltage line PL. At least one of the lines, for example, the driving voltage line PL, may be shared by pixels P adjacent to each other.

The plurality of thin-film transistors T1, T2, T3, T4, T5, T6, and T7 may include a driving transistor T1, a switching transistor T2, a compensation transistor T3, a first initialization transistor T4, an operation control transistor T5, an emission control transistor T6, and a second initialization transistor T7.

The organic light-emitting diode OLED may include a pixel electrode and an opposite electrode, the pixel electrode of the organic light-emitting diode OLED being connected to the driving transistor T1 through the emission control transistor T6 to receive a driving current, and the opposite electrode receiving the second power voltage (or common voltage) ELVSS. The organic light-emitting diode OLED may generate light of brightness corresponding to the driving current.

Some of the plurality of thin-film transistors T1, T2, T3, T4, T5, T6, and T7 may be n-channel metal-oxide semiconductor (NMOS) field-effect transistors (n-channel MOSFET), and the rest may be p-channel metal-oxide semiconductor (PMOS) field-effect transistors (p-channel MOSFET). As an example, among the plurality of thin-film transistors T1, T2, T3, T4, T5, T6, and T7, the compensation transistor T3 and the first initialization transistor T4 may be n-channel MOSFET (NMOS), and the rest may be p-channel MOSFET (PMOS). Alternatively, among the plurality of thin-film transistors T1, T2, T3, T4, T5, T6, and T7, the compensation transistor T3, the first initialization transistor T4, and the second initialization transistor T7 may be n-channel MOSFET (NMOS), and the rest may be p-channel MOSFET (PMOS). In another embodiment, each of the plurality of thin-film transistors T1, T2, T3, T4, T5, T6, and T7 may be n-channel MOSFET (NMOS) or p-channel MOSFET (PMOS). The plurality of thin-film transistors T1, T2, T3, T4, T5, T6, and T7 may each include amorphous silicon or polycrystalline silicon. When needed, a thin-film transistor, which is an n-channel MOSFET (NMOS), may include an oxide semiconductor. Hereinafter, for convenience of description, a case where the compensation transistor T3 and the first initialization transistor T4 are n-channel MOSFET (NMOS) and the rest of the thin-film transistors are p-channel MOSFET (PMOS) is described.

The signal lines may include a first scan line SL1, a second scan line SL2, a previous scan line SLp, a next scan line SLn, an emission control line EL, and a data line DL. The first scan line SL1 is configured to transfer a first scan signal Sn, the second scan line SL2 is configured to transfer a second scan signal Sn', the previous scan line SLp is configured to transfer a previous scan signal Sn−1 to the first initialization transistor T4, the next scan line SLn is configured to transfer a next scan signal Sn+1 to the second initialization transistor T7, and the emission control line EL is configured to transfer an emission control signal En to the operation control transistor T5 and the emission control transistor T6. The data line DL crosses the first scan line SL1 and is configured to transfer a data signal Dm.

The driving voltage line PL may be configured to transfer the driving voltage ELVDD to the driving transistor T1, the first initialization voltage line VL1 may be configured to transfer a first initialization voltage Vint1 initializing the driving transistor T1, and the second initialization voltage line VL2 may be configured to transfer a second initialization voltage Vint2 initializing a first electrode of the organic light-emitting diode OLED.

A driving gate electrode of the driving transistor T1 may be connected to the storage capacitor Cst through a second node N2, one of a source region and a drain region of the driving transistor T1 may be connected to the driving voltage line PL through the operation control transistor T5 via the first node N1, and the other of the source region and the drain region of the driving transistor T1 may be connected to the first electrode (e.g., the pixel electrode) of the organic light-emitting diode OLED through the emission control transistor T6 via a third node N3. The driving transistor T1 may be configured to receive a data signal Dm and supply the driving current to the organic light-emitting diode OLED according to a switching operation of the switching transistor T2. For instance, the driving transistor T1 may be configured to control the amount of current flowing from the first node N1 to the organic light-emitting diode OLED in response to a voltage applied to the second node N2 and changed by a data signal Dm, the first node N1 being electrically connected to the driving voltage line PL.

A switching gate electrode of the switching transistor T2 may be connected to the first scan line SL1 configured to transfer a first scan signal Sn, one of a source region and a drain region of the switching transistor T2 may be connected to the data line DL, and the other of the source region and the drain region of the switching transistor T2 may be connected to the driving transistor T1 through the first node N1 and connected to the driving voltage line PL through the fifth transistor T5. The switching transistor T2 may be configured to transfer a data signal Dm from the data line DL to the first node N1 in response to a voltage applied to the first scan line SL1. For instance, the switching transistor T2 may perform a switching operation of being turned on according to a first scan signal Sn transferred through the first scan line SL1 and transferring a data signal Dm to the driving transistor T1 through the first node N1, the data signal Dm being transferred through the data line DL.

A compensation gate electrode of the compensation transistor T3 is connected to the second scan line SL2. One of a source region and a drain region of the compensation transistor T3 may be connected to the first electrode of the organic light-emitting diode OLED through the emission control transistor T6 via the third node N3. The other of the source region and the drain region of the compensation transistor T3 may be connected to a first capacitor electrode CE1 of the storage capacitor Cst and the driving gate electrode of the driving transistor T1 through the second node N2. The compensation transistor T3 may diode-connect the driving transistor T1 by being turned on according to a second scan signal Sn' received through the second scan line SL2.

A first initialization gate electrode of the first initialization transistor T4 may be connected to the previous scan line SLp. One of a source region and a drain region of the first initialization transistor T4 may be connected to the first initialization voltage line VL1. The other of the source region and the drain region of the first initialization transistor T4 may be connected to the first capacitor electrode CE1 of the storage capacitor Cst and the driving gate electrode of the driving transistor T1 through the second node N2. The first initialization transistor T4 may be configured to apply the first initialization voltage Vint1 from the first initialization voltage line VL1 to the second node N2 according to a voltage applied to the previous scan line SLp. For instance, the first initialization transistor T4 may be turned on according to a previous scan signal Sn−1 received through the previous scan line SLp and may perform an initialization operation of initializing the voltage of the driving gate voltage of the driving transistor T1 by transferring the first initialization voltage Vint1 to the driving gate electrode of the driving transistor T1.

An operation gate electrode of the operation control transistor T5 may be connected to the emission control line EL, one of a source region and a drain region of the operation control transistor T5 may be connected to the driving voltage line PL, and the other of the source region and the drain region of the operation control transistor T5 may be connected to the driving transistor T1 and the switching transistor T2 through the first node N1.

An emission control gate electrode of the emission control transistor T6 may be connected to the emission control line EL, one of a source region and a drain region of the emission control transistor T6 may be connected to the driving transistor T1 and the compensation transistor T3 through the third node N3, and the other of the source region and the drain region of the emission control transistor T6 may be electrically connected to the first electrode (e.g., the pixel electrode) of the organic light-emitting diode OLED.

The operation control transistor T5 and the emission control transistor T6 may be turned on (e.g., simultaneously turned on) according to an emission control signal En transferred through the emission control line EL, the driving voltage ELVDD is transferred to the organic light-emitting diode OLED, and the driving current flows through the organic light-emitting diode OLED.

A second initialization gate electrode of the second initialization transistor T7 may be connected to the next scan line SLn, one of a source region and a drain region of the second initialization transistor T7 may be connected to the first electrode (e.g., the pixel electrode) of the organic light-emitting diode OLED, and the other of the source region and the drain region of the second initialization transistor T7 may be electrically connected to the second initialization voltage line VL2 to receive the second initialization voltage Vint2. The second initialization transistor T7 is turned on according to a next scan signal Sn+1 transferred through the next scan line SLn and initializes the first electrode (e.g., the pixel electrode) of the organic light-emitting diode OLED. The next scan line SLn may be the same as the first scan line SL1. In this case, the relevant scan line may be configured to transfer the same electric signals with a time difference, and thus, may serve as the first scan line SL1 and the next scan line SLn. For instance, the next scan line SLn may be a first scan line of a pixel electrically connected to the data line DL, the pixel being a pixel adjacent to the pixel P shown in FIG. 2.

As shown in FIG. 2, the second initialization transistor T7 may be connected to the first scan line SL1. However, embodiments are not limited thereto. For instance, the second initialization transistor T7 may be connected to the emission control line EL and driven according to an emission control signal En.

The storage capacitor Cst may include the first capacitor electrode CE1 and a second capacitor electrode CE2. The first capacitor electrode CE1 of the storage capacitor Cst is connected to the driving gate electrode of the driving transistor T1 through the second node N2, and the second capacitor electrode CE2 of the storage capacitor Cst is connected to the driving voltage line PL. The storage capacitor Cst may store charge corresponding to a difference between a voltage of the driving gate electrode of the driving transistor T1 and the driving voltage ELVDD.

A specific operation of each pixel P according to an embodiment will now be described in more detail.

For an initialization period, when a previous scan signal Sn−1 is supplied through the previous scan line SLp, the first initialization transistor T4 is turned on according to the previous scan signal Sn−1, and the driving transistor T1 is initialized by the first initialization voltage Vint1 supplied from the first initialization voltage line VL1.

For a data programming period, when a first scan signal Sn and a second scan signal Sn' are respectively supplied through the first scan line SL1 and the second scan line SL2, the switching transistor T2 and the compensation transistor T3 are turned on according to the first scan signal Sn and the second scan signal Sn'. In this case, the driving transistor T1 is diode-connected and forward-biased by the compensation transistor T3 that is turned on. Then, a compensation voltage Dm+Vth (Vth has a (−) value) is applied to the driving gate electrode G1 of the driving transistor T1, the compensation voltage Dm+Vth being a voltage that is reduced by a threshold voltage Vth of the driving transistor T1 from a data signal Dm supplied through the data line DL. The driving voltage ELVDD and the compensation voltage Dm+Vth are respectively applied to two opposite ends of the storage capacitor Cst. Charge corresponding to a voltage difference between the two opposite ends of the storage capacitor Cst is stored in the storage capacitor Cst.

For an emission period, the operation control transistor T5 and the emission control transistor T6 are turned on according to an emission control signal En supplied through the emission control line EL. The driving current occurs, the driving current corresponding to a voltage difference between a voltage of the gate electrode of the driving transistor T1 and the driving voltage ELVDD. The driving current is supplied to the organic light-emitting diode OLED through the emission control transistor T6.

As described above, some of the plurality of thin-film transistors T1, T2, T3, T4, T5, T6, and T7 may include an oxide semiconductor. As an example, the compensation transistor T3 and the first initialization transistor T4 may each include an oxide semiconductor.

At least because polycrystalline silicon has high reliability, a current accurately intended may be controlled to flow. Accordingly, the driving transistor T1 directly influencing the brightness of the display apparatus 10 may include a semiconductor layer including polycrystalline silicon having high reliability, and thus, the display apparatus 10 having high resolution may be implemented through this configuration. At least because an oxide semiconductor has high carrier mobility and a low leakage current, a voltage drop is not large even when a driving time is long. For example, at least because, in case of an oxide semiconductor, a color change of an image due to a voltage drop is not large even when a display apparatus is driven at low frequencies, the display apparatus may be driven at low frequencies. Accordingly, because the compensation transistor T3 and the first initialization transistor T4 may each include an oxide semiconductor, the display apparatus 10 may prevent a leakage current from occurring, and simultaneously, reduce power consumption.

The oxide semiconductor is sensitive to light, and thus, a change in the amount of current and the like may occur due to external light. Accordingly, a metal layer may be arranged below the oxide semiconductor to absorb or reflect external light. Accordingly, as shown in FIG. 2, the compensation transistor T3 and the first initialization transistor T4 each including an oxide semiconductor may be respectively arranged above and below the oxide semiconductor layer. For instance, when viewed in a direction (e.g., a z-axis direction) perpendicular to the upper surface of the substrate 100, a metal layer arranged below the oxide semiconductor may overlap an oxide semiconductor.

Figure 3:
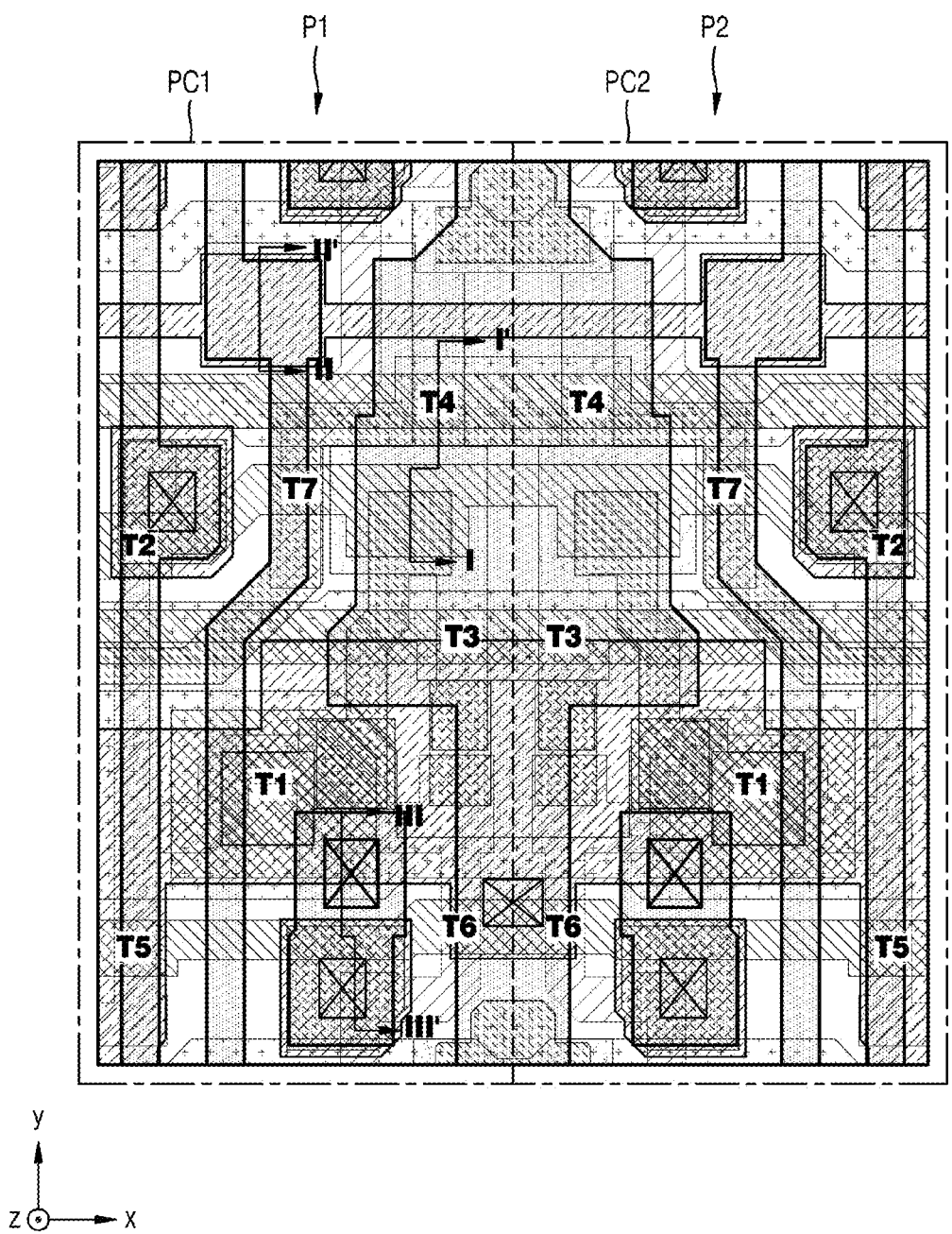
FIG. 3 is a schematic configuration view of positions of transistors, capacitors, and the like in pixels of a display apparatus according to an embodiment.

FIG. 3 is a schematic configuration view of the positions of transistors, capacitors, and the like in pixels of the display apparatus 10 of FIG. 1 according to an embodiment. FIGS. 4 to 11 are schematic configuration views, for each layer, of elements such as transistors, capacitors, and the like of the display apparatus 10 shown in FIG. 3 according to some embodiments. FIG. 12 is a schematic cross-sectional view of the display apparatus 10 shown in FIG. 3 taken along sectional lines I-I', II-II', and III-III' according to an embodiment.

As shown in the drawings, the display apparatus 10 may include a first pixel P1 and a second pixel P2 adjacent to each other. As shown in FIG. 3, the first pixel P1 and the second pixel P2 may be symmetric to each other with respect to a virtual line, such as the dashed in FIG. 3. Unlike this, the first pixel P1 and the second pixel P2 may have the same structure instead of a symmetric structure. The first pixel P1 may include a first pixel circuit PC1, and the second pixel P2 may include a second pixel circuit PC2. Hereinafter, for convenience of description, though some of conductive patterns are described based on the first pixel circuit PC1, the conductive patterns may be symmetrically arranged also in the second pixel circuit PC2. The first pixel circuit PC1 or the second pixel circuit PC2 means the pixel circuit denoted by the reference numeral PCm in FIG. 1. Each of the first pixel circuit PC1 and the second pixel circuit PC2 is electrically connected to an organic light-emitting element OLED. The organic light-emitting element OLED means a display element denoted by the reference numeral EDm in FIG. 1.

A buffer layer 111 (see FIG. 12) may be arranged on the substrate 100, the buffer layer 111 including at least one of silicon oxide, silicon nitride, and silicon oxynitride. The buffer layer 111 may prevent metal atoms or impurities from diffusing to a first semiconductor layer 1100 arranged thereon from the substrate 100. In addition, the buffer layer 111 may make the first semiconductor layer 1100 uniformly crystallized by adjusting a providing speed of heat during a crystallization process of forming the first semiconductor layer 1100.

Figure 4:
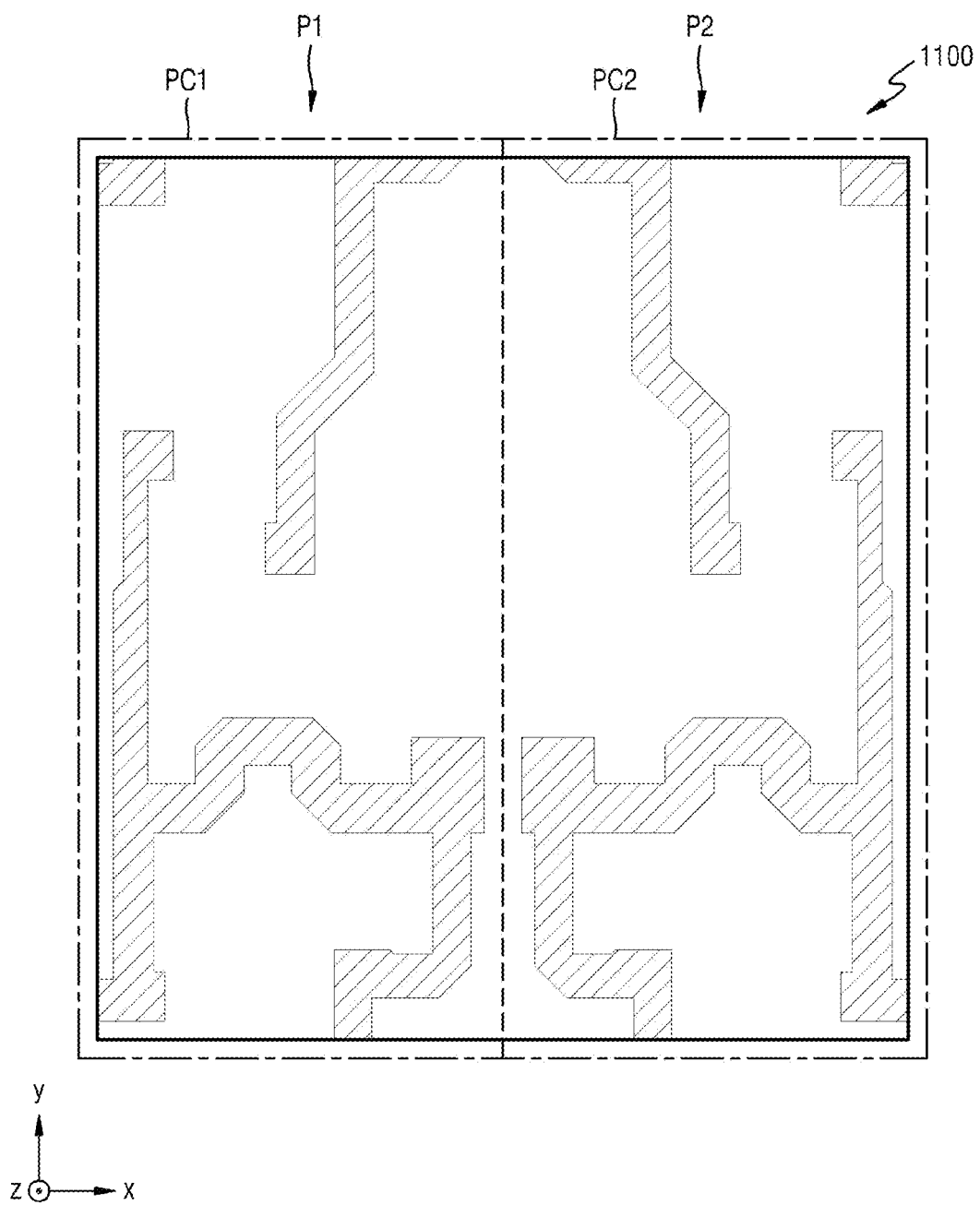
FIGS. 4, 5, 6, 7, 8, 9, 10, and 11 are schematic configuration views, for each layer, of elements, such as transistors, capacitors, and the like, of the display apparatus shown in FIG. 3 according to some embodiments.

The first semiconductor layer 1100 shown in FIG. 4 may be arranged on the buffer layer 111. The first semiconductor layer 1100 may include a silicon semiconductor. As an example, the first semiconductor layer 1100 may include amorphous silicon or polycrystalline silicon. For example, the first semiconductor layer 1100 may include polycrystalline silicon crystallized at low temperature. When needed or desired, ions may be injected into at least a portion of the first semiconductor layer 1100.

The driving transistor T1, the switching transistor T2, the operation control transistor T5, the emission control transistor T6, and the second initialization transistor T7 may be PMOS transistors as described above. In this case, the thin-film transistors are arranged along the first semiconductor layer 1100 as shown in FIG. 4.

A first gate insulating layer 113 (see FIG. 12) may cover the first semiconductor layer 1100 and be disposed over the substrate 100. The first gate insulating layer 113 may include an insulating material. As an example, the first gate insulating layer 113 may include at least one of silicon oxide, silicon nitride, silicon oxynitride, and aluminum oxide.

Figure 5:
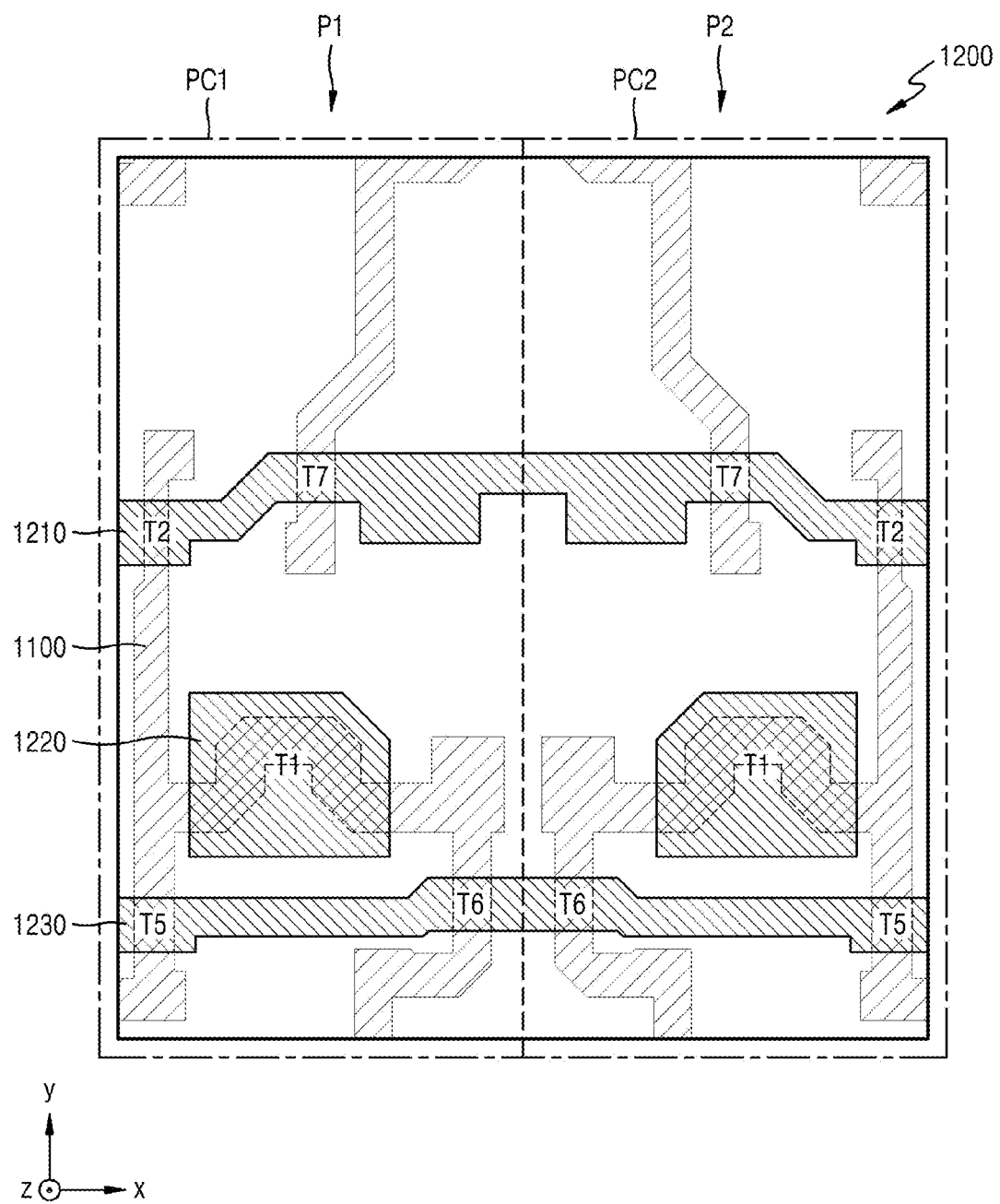

A first gate layer 1200 shown in FIG. 5 may be arranged on the first gate insulating layer 113. For convenience of description, the first gate layer 1200 is shown together with the first semiconductor layer 1100. The first gate layer 1200 may include a first gate line 1210, a first gate electrode 1220, and a second gate electrode/line 1230.

The first gate line 1210 may extend in a first direction (e.g., a (−) x-direction). The first gate line 1210 may be the first scan line SL1 or the next scan line SLn of FIG. 2. For instance, the first gate line 1210 may correspond to the first scan line SL1 of FIG. 2 with respect to the first pixel P1 shown in FIG. 5, and the first gate line 1210 may correspond to the next scan line SLn of FIG. 2 with respect to a pixel adjacent (e.g., in a (+) y-direction) to the first pixel P1. Accordingly, a first scan signal Sn and a next scan signal Sn+1 may be applied to the pixels through the first gate line 1210. Portions of the first gate line 1210 overlapping the first semiconductor layer 1100 may be a switching gate electrode of the switching transistor T2 and a second initialization gate electrode of the second initialization transistor T7.

The first gate electrode 1220 may have an isolated shape. The first gate electrode 1220 is a driving gate electrode of the driving transistor T1. For reference, a portion of the first semiconductor layer 1100 overlapping the first gate electrode 1220 and a portion in the neighborhood thereof may be referred to as a driving semiconductor layer.

The second gate line 1230 may extend in the first direction (e.g., the (−) x-direction). The second gate line 1230 may correspond to the emission control line EL of FIG. 2. Portions of the second gate line 1230 overlapping the first semiconductor layer 1100 may be an operation control gate electrode of the operation control transistor T5 and an emission control gate electrode of the emission control transistor T6. An emission control signal En may be applied to the pixels through the second gate line 1230.

The first gate layer 1200 may include at least one of metal, an alloy, a conductive metal oxide, and a transparent conductive material. As an example, the first gate layer 1200 may include at least one of silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), and indium zinc oxide (IZO). The first gate layer 1200 may have a multi-layered structure. As an example, the first gate layer 1200 may have a two-layered structure of Mo/Al or have a three-layered structure of Mo/Al/Mo.

A second gate insulating layer 115 (see FIG. 12) may cover the first gate layer 1200 and may be arranged on the first gate insulating layer 113. The second gate insulating layer 115 may include an insulating material that is the same as or similar to that of the first gate insulating layer 113.

Figure 6:
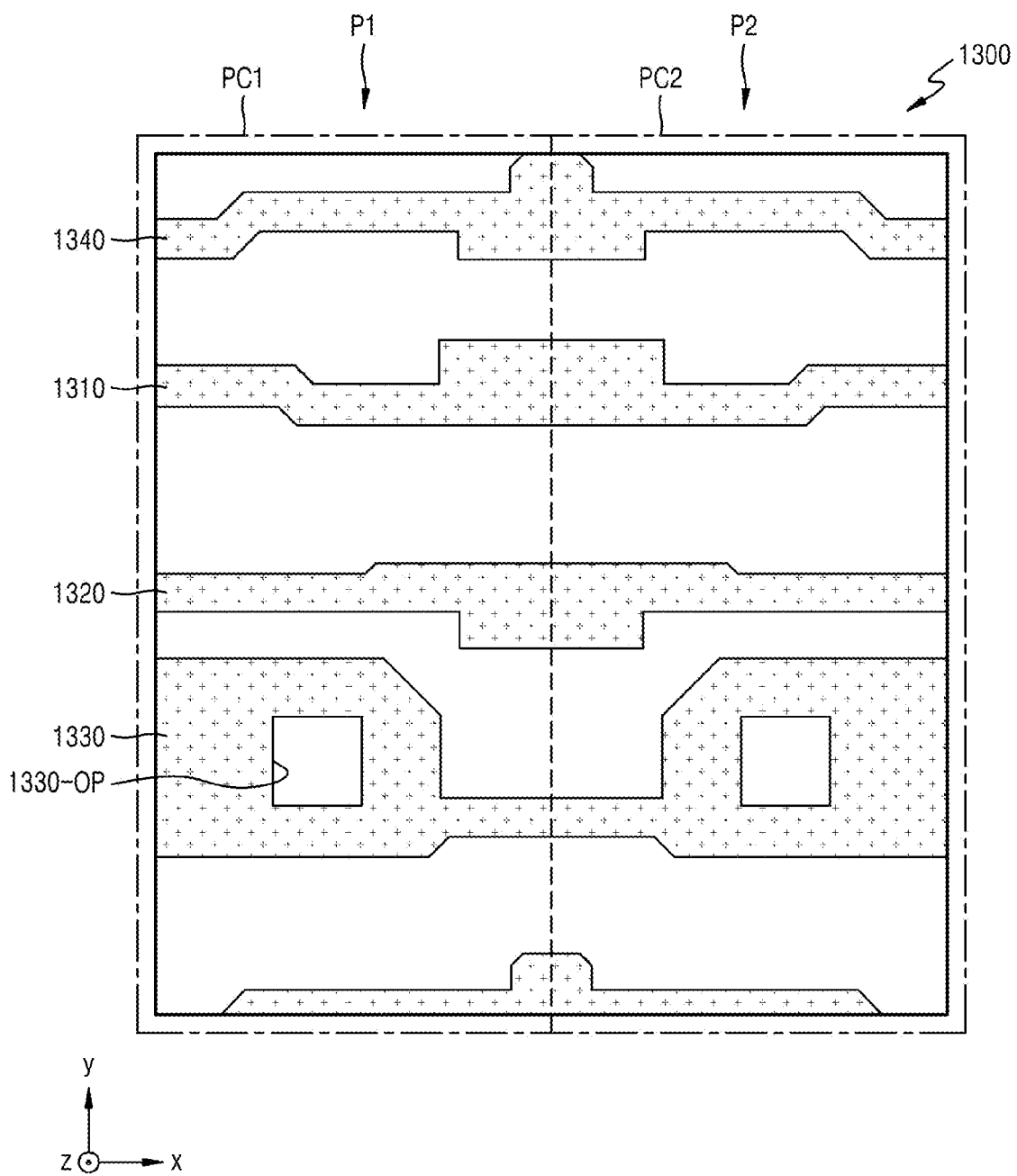

A second gate layer 1300 shown in FIG. 6 may be arranged on the second gate insulating layer 115. The second gate layer 1300 may include a third gate line 1310, a fourth gate line 1320, a capacitor upper electrode 1330, and a first initialization voltage line 1340 (e.g., the first initialization voltage line VL1 of FIG. 2).

The third gate line 1310 may extend in the first direction (e.g., the (−) x-direction). The third gate line 1310 may correspond to the previous scan line SLp of FIG. 2. When viewed in a direction (e.g., a z-axis direction) perpendicular to the substrate 100, the third gate line 1310 may be apart from the first gate line 1210. A previous scan signal Sn−1 may be applied to the pixels through the third gate line 1310. A portion of the third gate line 1310 overlapping a second semiconductor layer 1400 described below may be a first initialization lower gate electrode of the first initialization transistor T4.

The fourth gate line 1320 may extend in the first direction (e.g., the (−) x-direction). The fourth gate line 1320 may correspond to the second scan line SL2 of FIG. 2. When viewed in a direction (e.g., the z-axis direction) perpendicular to the substrate 100, the fourth gate line 1320 may be apart from the first gate line 1210 and the third gate line 1310. A second scan signal Sn' may be applied to the pixels through the fourth gate line 1320. A portion of the fourth gate line 1320 overlapping the second semiconductor layer 1400 may be a compensation lower gate electrode of the compensation transistor T3.

The third gate line 1310 and the fourth gate line 1320 may be arranged below the second semiconductor layer 1400 described below with reference to FIG. 7 to serve not only as gate electrodes, but also as lower protection metals that protect portions of the second semiconductor layer 1400 overlapping the third gate line 1310 and the fourth gate line 1320.

The capacitor upper electrode 1330 may overlap the first gate electrode 1220 and extend in the first direction (e.g., the (−) x-direction). The capacitor upper electrode 1330 may correspond to the second capacitor electrode CE2 of FIG. 2 and constitute the storage capacitor Cst in cooperation with the first gate electrode 1220. The driving voltage ELVDD may be applied to the capacitor upper electrode 1330. In addition, a hole may be formed in the capacitor upper electrode 1330, the hole passing through the capacitor upper electrode 1330. At least a portion of the first gate electrode 1220 may overlap the hole.

The first initialization voltage line 1340 corresponding to the first initialization voltage line VL1 of FIG. 2 may extend in the first direction (e.g., the (−) x-direction). When viewed in a direction (e.g., the z-axis direction) perpendicular to the substrate 100, the first initialization voltage line 1340 may be apart from the third gate line 1310. The first initialization voltage Vint1 may be applied to the pixels through the first initialization voltage line 1340. The first initialization voltage line 1340 may overlap at least a portion of the second semiconductor layer 1400 and may be configured to transfer the first initialization voltage Vint1 to the second semiconductor layer 1400. The first initialization voltage line 1340 may be electrically connected to the second semiconductor layer 1400 through contact holes 1680CNT1, 1680CNT2, and 1680CNT3 described below with reference to FIG. 9.

The second gate layer 1300 may include at least one of a metal, an alloy, a conductive metal oxide, and a transparent conductive material. As an example, the second gate layer 1300 may include at least one of silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), and indium zinc oxide (IZO). The second gate layer 1300 may have a multi-layered structure. As an example, the second gate layer 1300 may have a two-layered structure of Mo/Al or have a three-layered structure of Mo/Al/Mo.

A first interlayer insulating layer 117 (see FIG. 12) may cover the second gate layer 1300 and may be arranged on the second gate insulating layer 115. The first interlayer insulating layer 117 may include an insulating material. As an example, the first interlayer insulating layer 117 may include at least one of silicon oxide, silicon nitride, silicon oxynitride, and aluminum oxide.

Figure 7:
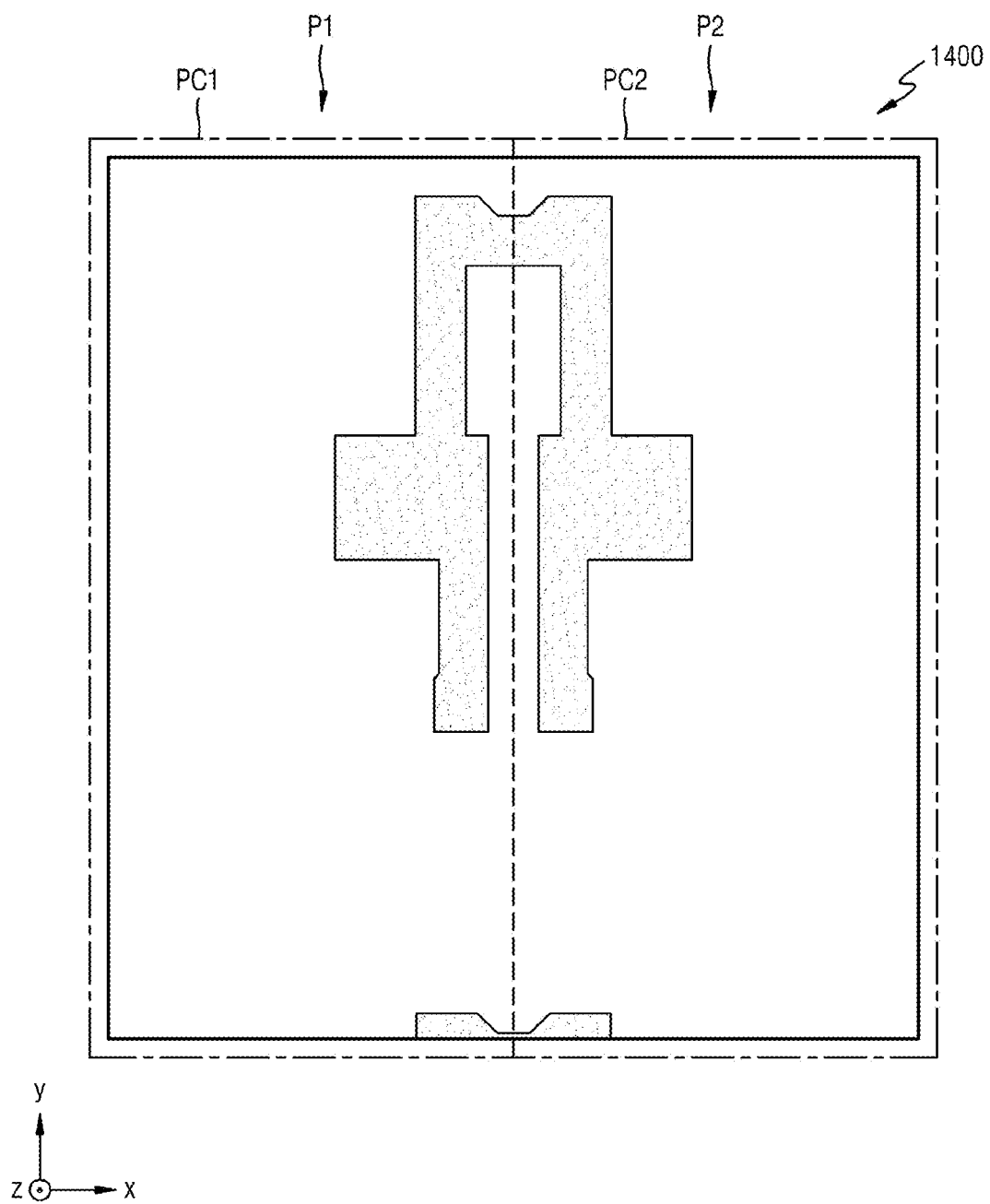

The second semiconductor layer 1400 shown in FIG. 7 may be arranged on the first interlayer insulating layer 117. As described above, the second semiconductor layer 1400 may include an oxide semiconductor. The second semiconductor layer 1400 may be arranged in a layer different from the first semiconductor layer 1100. When viewed in a direction (e.g., the z-axis direction) perpendicular to the substrate 100, the second semiconductor layer 1400 may not overlap the first semiconductor layer 1100.

A third gate insulating layer 118 (see FIG. 12) may cover the second semiconductor layer 1400 and may be arranged on the first interlayer insulating layer 117. The third gate insulating layer 118 may include an insulating material. As shown in FIG. 12, the third gate insulating layer 118 may be arranged only on a portion of the second semiconductor layer 1400 and may not be arranged on the first interlayer insulating layer 117. In the latter case, as shown in FIG. 12, the third gate insulating layer 118 may have the same pattern as that of a third gate layer 1500 described below with reference to FIG. 8. For instance, when viewed in a direction (e.g., the z-axis direction) perpendicular to the substrate 100, the third gate insulating layer 118 may completely or nearly completely overlap the third gate layer 1500. This is because the third gate insulating layer 118 and the third gate layer 1500 may be simultaneously patterned. Accordingly, except for channel regions overlapping the third gate layer 1500, source regions and drain regions of the second semiconductor layer 1400 may not be covered by the third gate insulating layer 118. The source regions and drain regions may directly contact a second interlayer insulating layer 119, as shown in FIG. 12. The third gate insulating layer 118 may include at least one of silicon oxide, silicon nitride, silicon oxynitride, and aluminum oxide.

Figure 8:
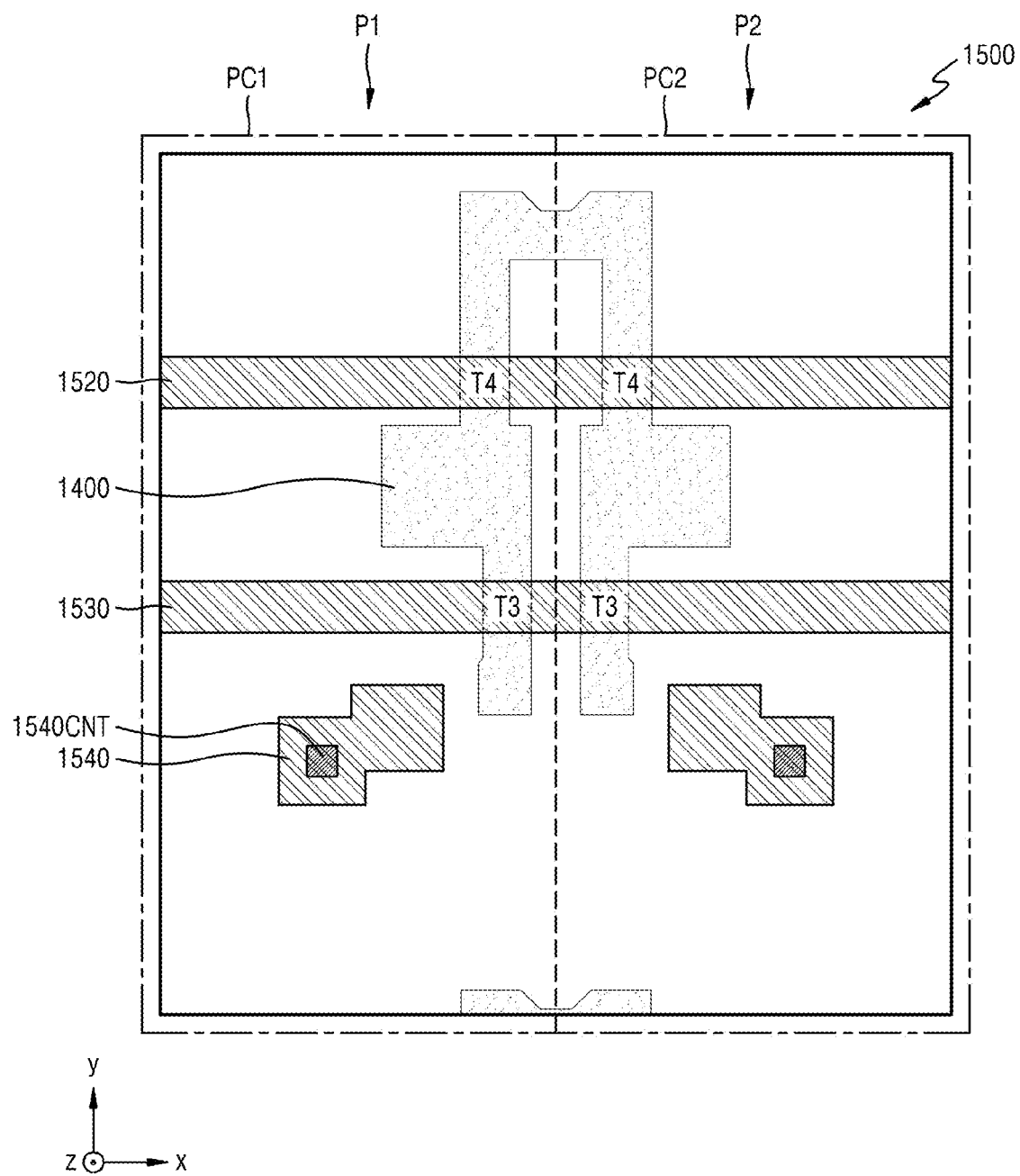

The third gate layer 1500 shown in FIG. 8 may be arranged on the third gate insulating layer 118. The third gate layer 1500 may include a fifth gate line 1520, a sixth gate line 1530, and a first transfer line 1540.

The fifth gate line 1520 may extend in the first direction (e.g., the (−) x-direction). When viewed in a direction (e.g., the z-axis direction) perpendicular to the substrate 100, the fifth gate line 1520 may overlap the third gate line 1310. A portion of the fifth gate line 1520 overlapping the second semiconductor layer 1400 may be a first initialization upper gate electrode of the first initialization transistor T4. A portion of the second semiconductor layer 1400 overlapping the fifth gate line 1520 and a portion in the neighborhood thereof may be referred to as a first initialization semiconductor layer. The fifth gate line 1520 may be electrically connected to the third gate line 1310. As an example, the fifth gate line 1520 may be electrically connected to the third gate line 1310 through a contact hole formed in an insulating layer between the fifth gate line 1520 and the third gate line 1310. The contact hole may be formed in the display area DA or formed in the peripheral area PA. Accordingly, both the fifth gate line 1520 and the third gate line 1310 may correspond to the previous scan line SLp of FIG. 2. Accordingly, a previous scan signal Sn−1 may be applied to the pixels through the fifth gate line 1520 and/or the third gate line 1310.

The sixth gate line 1530 may extend in the first direction (e.g., the (−) x-direction). When viewed in a direction (e.g., the z-axis direction) perpendicular to the substrate 100, the sixth gate line 1530 may overlap the fourth gate line 1320. A portion of the sixth gate line 1530 overlapping the second semiconductor layer 1400 may be a compensation upper gate electrode of the compensation transistor T3. The sixth gate line 1530 may be electrically connected to the fourth gate line 1320. As an example, the sixth gate line 1530 may be electrically connected to the fourth gate line 1320 through a contact hole formed in an insulating layer between the sixth gate line 1530 and the fourth gate line 1320. The contact hole may be formed in the display area DA or formed in the peripheral area PA. Accordingly, both the sixth gate line 1530 and the fourth gate line 1320 may correspond to the second scan line SL2 of FIG. 2. Accordingly, a second scan signal Sn' may be applied to the pixels through the sixth gate line 1530 and/or the fourth gate line 1320.

The first transfer line 1540 may be electrically connected to the first gate electrode 1220, which is the driving gate electrode, through a contact hole 1540CNT passing through an opening 1330-OP of the capacitor upper electrode 1330. The first transfer line 1540 may be configured to transfer the first initialization voltage Vint1 to the first gate electrode 1220, the first initialization voltage Vint1 being transferred through the first initialization transistor T4.

The third gate layer 1500 may include at least one of metal, an alloy, a conductive metal oxide, and a transparent conductive material. As an example, the third gate layer 1500 may include at least one of silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), and indium zinc oxide (IZO). The third gate layer 1500 may have a multi-layered structure. As an example, the third gate layer 1500 may have a two-layered structure of Mo/Al or have a three-layered structure of Mo/Al/Mo.

The second interlayer insulating layer 119 (see FIG. 12) may cover at least a portion of the third gate layer 1500 of FIG. 8. The second interlayer insulating layer 119 may include an insulating material. As an example, the second interlayer insulating layer 119 may include at least one of silicon oxide, silicon nitride, silicon oxynitride, and aluminum oxide.

Figure 9:
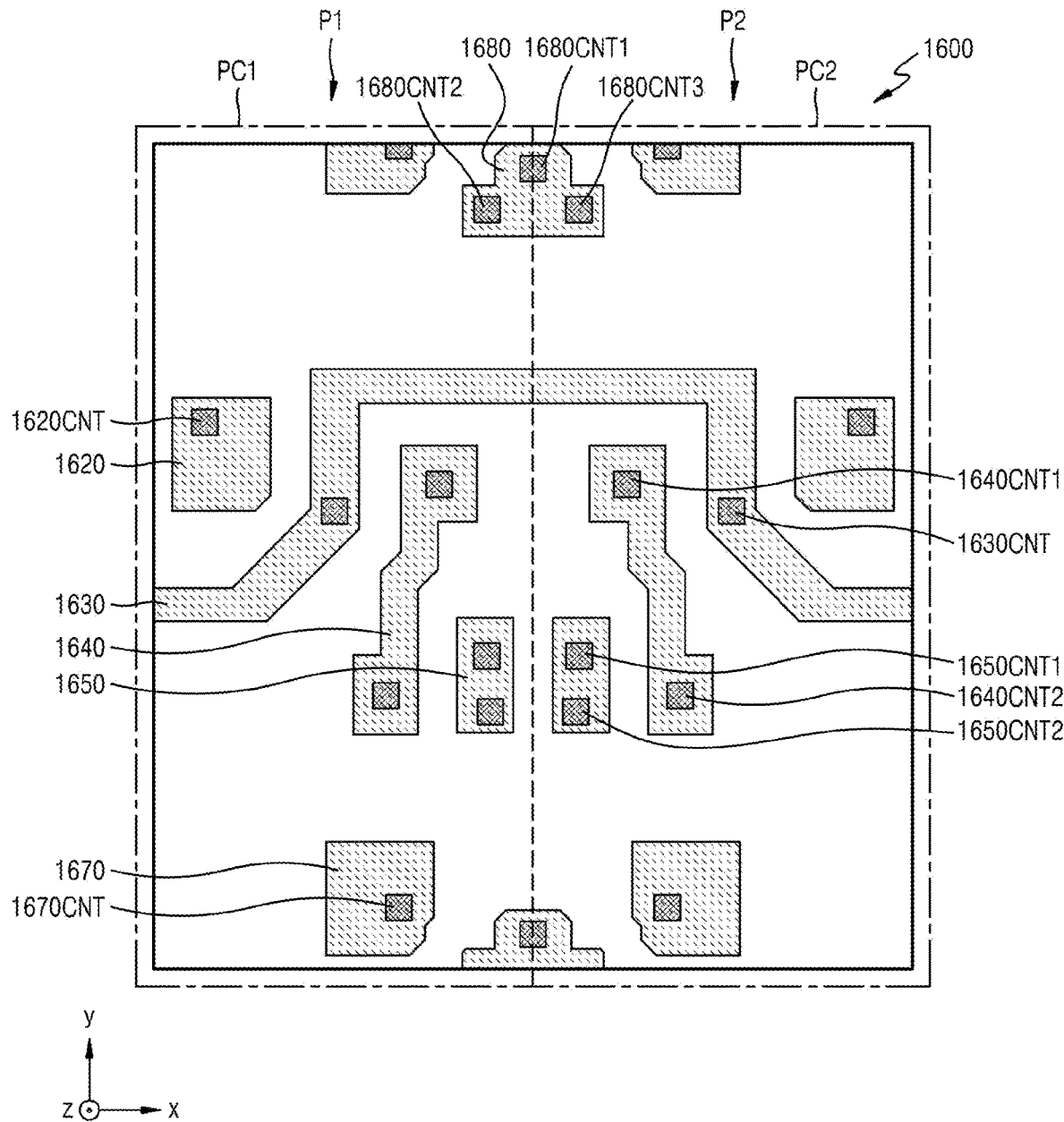

A first connection electrode layer 1600 shown in FIG. 9 may be arranged on the second interlayer insulating layer 119. The first connection electrode layer 1600 may include a second transfer line 1620, a second initialization voltage line 1630, a third transfer line 1640, a fourth transfer line 1650, a fifth transfer line 1670, and a sixth transfer line 1680.

The second transfer line 1620 may be electrically connected to the first semiconductor layer 1100 through a contact hole 1620CNT. A data signal Dm from a data line 1810 described below with reference to FIG. 11 may be transferred to the first semiconductor layer 1100 through the second transfer line 1620 and applied to the switching transistor T2.

The second initialization voltage line 1630 may extend in the first direction (e.g., the (−) x-direction). The second initialization voltage line 1630 may be configured to apply the second initialization voltage Vint2 to the pixels, the second initialization voltage line 1630 corresponding to the second initialization voltage line VL2 of FIG. 2. The second initialization voltage line 1630 may be electrically connected to the first semiconductor layer 1100 through a contact hole 1630CNT, and the second initialization voltage Vint2 may be transferred to the first semiconductor layer 1100 and applied to the second initialization transistor T7.

The third transfer line 1640 may electrically connect the second semiconductor layer 1400 to the first transfer line 1540 through contact holes 1640CNT1 and 1640CNT2 respectively formed in one side and another side thereof. Given that the first transfer line 1540 is electrically connected to the first gate electrode 1220, which is the driving gate electrode, the third transfer line 1640 may electrically connect the first initialization semiconductor layer, which is a portion of the second semiconductor layer 1400, to the driving gate electrode, consequently. The first initialization voltage Vint1 may be transferred to the first gate electrode 1220, which is the driving gate electrode, through the second semiconductor layer 1400, the third transfer line 1640, and the first transfer line 1540.

The fourth transfer line 1650 may electrically connect the second semiconductor layer 1400 to the first semiconductor layer 1100 through contact holes 1650CNT1 and 1650CNT2 respectively formed in one side and another side of the fourth transfer line 1650. For instance, the fourth transfer line 1650 may electrically connect the compensation transistor T3 to the driving transistor T1.

The fifth transfer line 1670 may be electrically connected to the first semiconductor layer 1100 through a contact hole 1670CNT. The fifth transfer line 1670 may be configured to transfer a driving current or the second initialization voltage Vint2 from the first semiconductor layer 1100 to the organic light-emitting diode OLED.

The sixth transfer line 1680 may be electrically connected to the second semiconductor layer 1400 through contact holes 1680CNT2 and 1680CNT3. In addition, the sixth transfer line 1680 may be electrically connected to the first initialization voltage line 1340 of FIG. 6 through a contact hole 1680CNT1. Through this configuration, the sixth transfer line 1680 may be configured to transfer the first initialization voltage Vint1 from the first initialization voltage line 1340 to the first initialization transistor T4.

The first connection electrode layer 1600 may include at least one of a metal, an alloy, a conductive metal oxide, and a transparent conductive material. As an example, the first connection electrode layer 1600 may include at least one of silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), and indium zinc oxide (IZO). The first connection electrode layer 1600 may have a multi-layered structure. As an example, the first connection electrode layer 1600 may have a two-layered structure of Ti/Al or have a three-layered structure of Ti/Al/Ti.

A first planarization insulating layer 121 may cover the first connection electrode layer 1600 and may be arranged on the second interlayer insulating layer 119. The first planarization insulating layer 121 may include an organic insulating material. As an example, the first planarization insulating layer 121 may include at least one of a photoresist, benzocyclobutene (BCB), polyimide, hexamethyldisiloxane (HMDSO), polymethylmethacrylate (PMMA) or polystyrene, polymer derivatives having a phenol-based group, an acryl-based polymer, an imide-based polymer, an aryl ether-based polymer, an amide-based polymer, a fluorine-based polymer, a p-xylene-based polymer, and a vinyl alcohol-based polymer, or any compound thereof.

Figure 10:
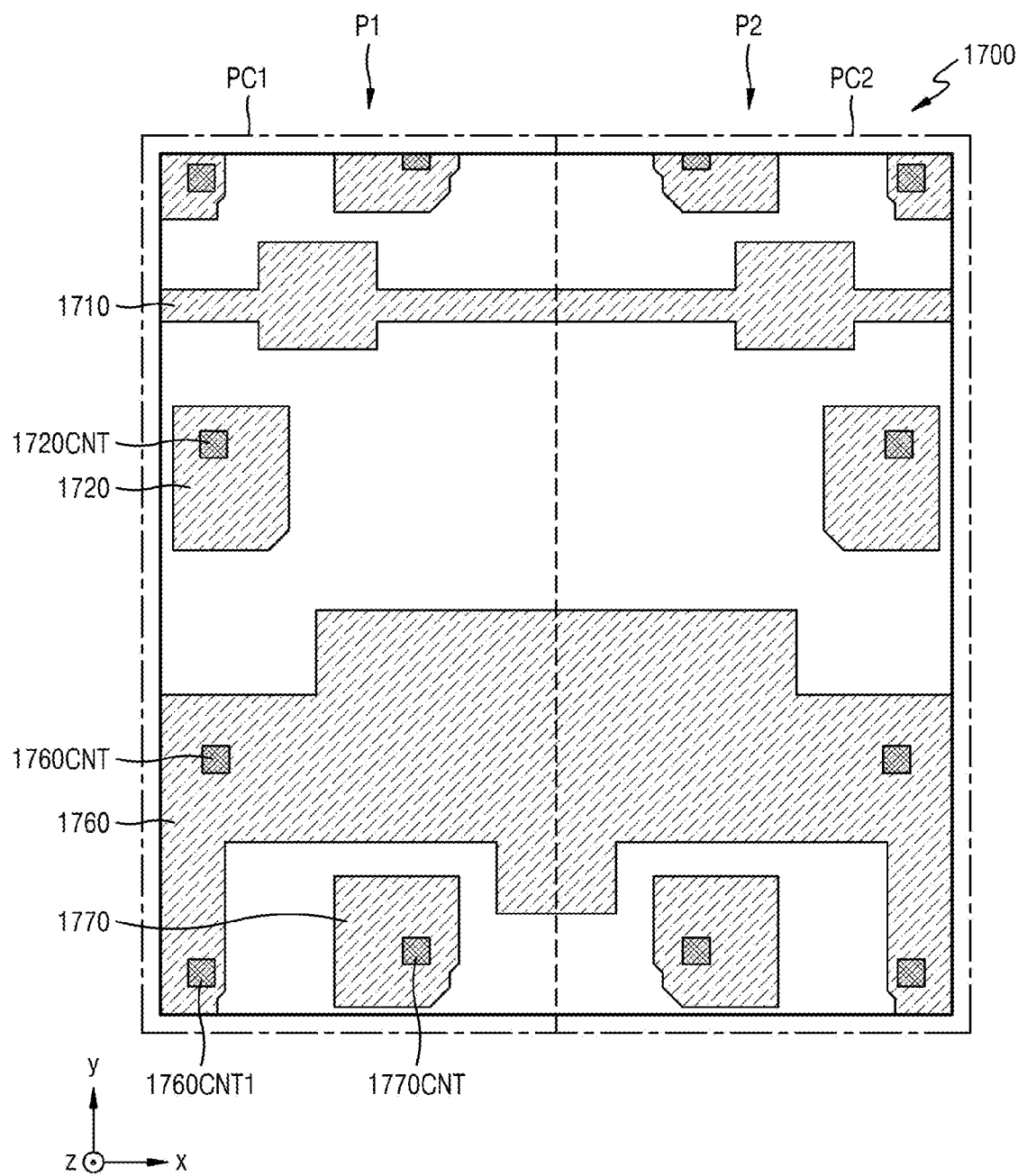

A second connection electrode layer 1700 shown in FIG. 10 may be arranged on the first planarization insulating layer 121. The second connection electrode layer 1700 may include a horizontal connection line 1710, a seventh transfer line 1720, an eighth transfer line 1760, and a ninth transfer line 1770.

The horizontal connection line 1710 may extend in the first direction (e.g., the (−) x-direction). The horizontal connection line 1710 may be at least a portion of a bridge line BL described below with reference to FIG. 13.

The seventh transfer line 1720 may be electrically connected to the second transfer line 1620 described above through a contact hole 1720CNT. A data signal Dm from a data line 1810 (shown in FIG. 11) may be transferred to the first semiconductor layer 1100 through the seventh transfer line 1720 and the second transfer line 1620 and applied to the switching transistor T2.

The eighth transfer line 1760 may extend in the first direction (e.g., the (−) x-direction). The driving voltage ELVDD from a driving voltage line 1830 (shown in FIG. 11) may be transferred to the eighth transfer line 1760. The eighth transfer line 1760 electrically connected to the first semiconductor layer 1100 through a contact hole 1760CNT may be configured to transfer the driving voltage ELVDD to the first semiconductor layer 1100, specifically, the operation control transistor T5. In addition, the eighth transfer line 1760 electrically connected to the capacitor upper electrode 1330 (e.g., the second capacitor electrode CE2 of FIG. 2) through the contact hole 1760CNT may be configured to transfer the driving voltage ELVDD to the capacitor upper electrode 1330.

The ninth transfer line 1770 may be electrically connected to the fifth transfer line 1670 through a contact hole 1770CNT. The ninth transfer line 1770 may be configured to receive the driving current from the first semiconductor layer 1100 or the second initialization voltage Vint2 from the fifth transfer line 1670 and transfer the same to the organic light-emitting diode OLED.

The second connection electrode layer 1700 may include at least one of a metal, an alloy, a conductive metal oxide, and a transparent conductive material. As an example, the second connection electrode layer 1700 may include at least one of silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), and indium zinc oxide (IZO). The second connection electrode layer 1700 may have a multi-layered structure. As an example, the second connection electrode layer 1700 may have a two-layered structure of Ti/Al or have a three-layered structure of Ti/Al/Ti.

A second planarization insulating layer 123 (see FIG. 12) may cover the second connection electrode layer 1700 and may be arranged on the first planarization insulating layer 121. The second planarization insulating layer 123 may include an organic insulating material. As an example, the second planarization insulating layer 123 may include at least one of a photoresist, benzocyclobutene (BCB), polyimide, hexamethyldisiloxane (HMDSO), polymethylmethacrylate (PMMA) or polystyrene, polymer derivatives having a phenol-based group, an acryl-based polymer, an imide-based polymer, an aryl ether-based polymer, an amide-based polymer, a fluorine-based polymer, a p-xylene-based polymer, and a vinyl alcohol-based polymer, or any compound thereof.

Figure 11:
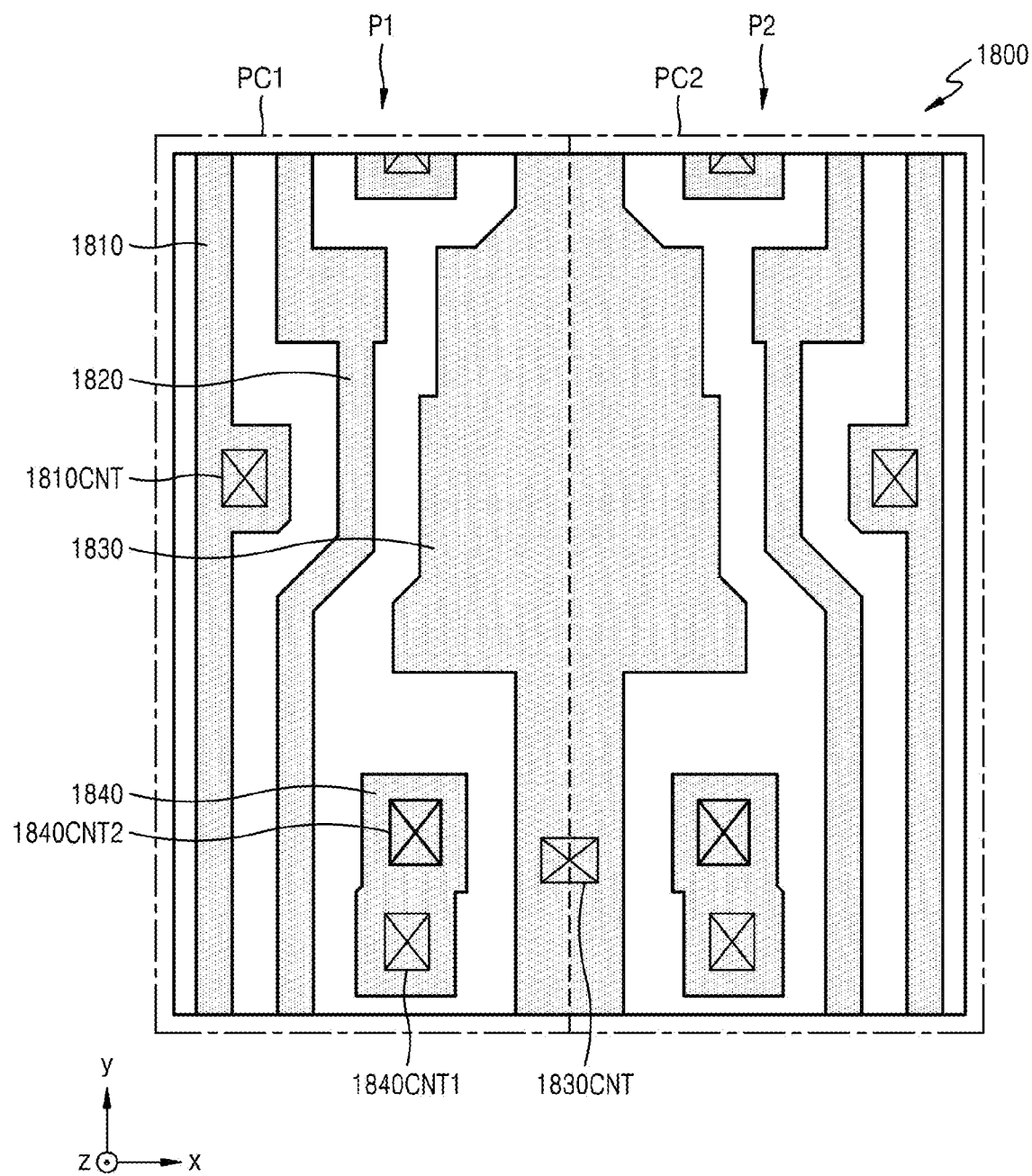
Figure 12:
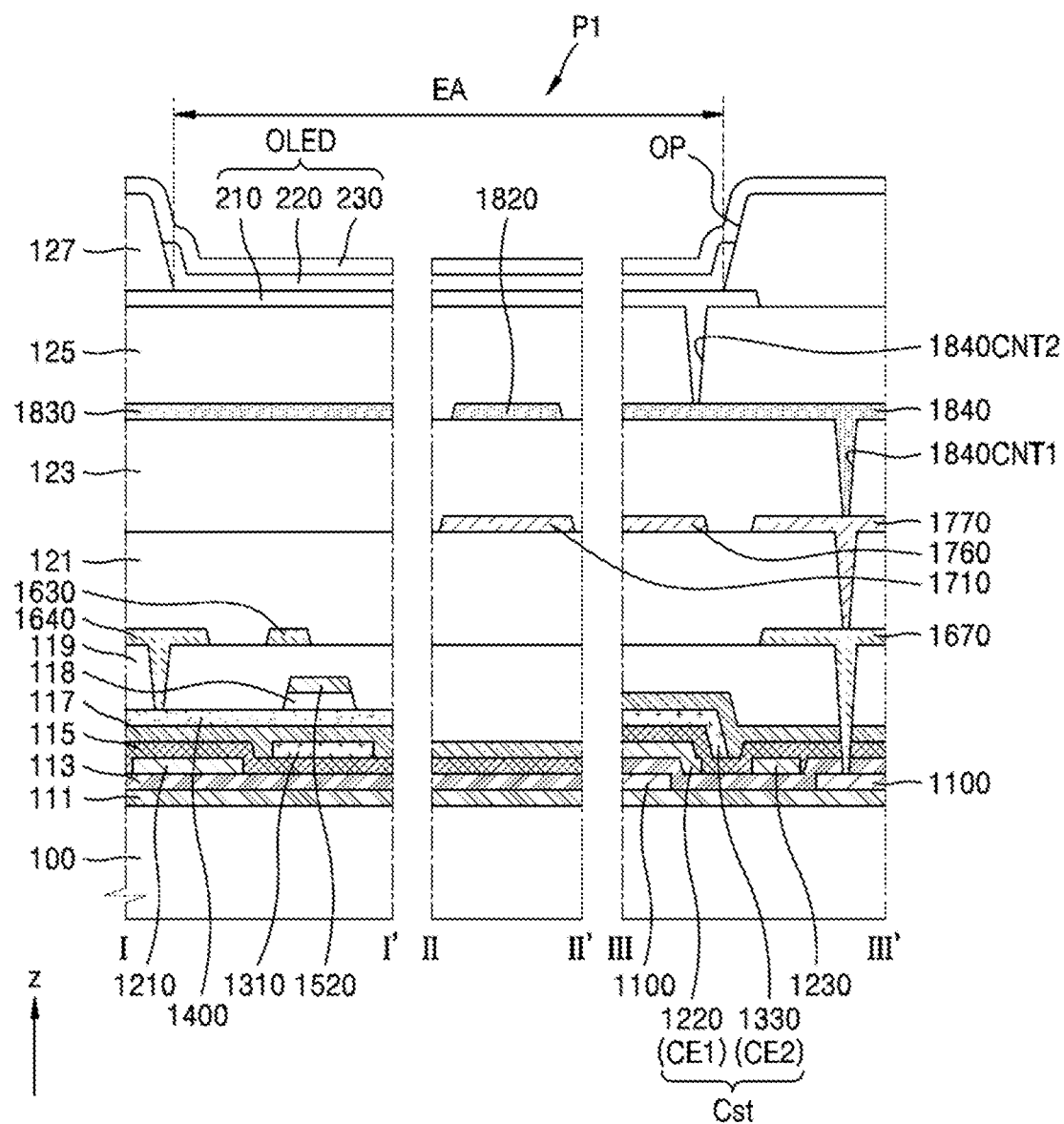
FIG. 12 is a schematic cross-sectional view of the display apparatus shown in FIG. 3 taken along sectional lines I-I', II-II', and III-III' according to an embodiment.

A third connection electrode layer 1800 shown in FIG. 11 may be arranged on the second planarization insulating layer 123. The third connection electrode layer 1800 may include the data line 1810, a vertical connection line 1820, the driving voltage line 1830, and a tenth transfer line 1840.

The data line 1810 may extend in a second direction (e.g., a y-axis direction). The data line 1810 may correspond to the data line DL of FIG. 2. In addition, the data line 1810 may be one of a first data line DL1, a second data line DL2, a third data line DL3, and a fourth data line DL4 described below with reference to FIG. 13 depending on the position of a pixel. The data line 1810 may be electrically connected to the seventh transfer line 1720 through a contact hole 1810CNT. A data signal Dm from the data line 1810 may be transferred to the first semiconductor layer 1100 through the seventh transfer line 1720 and the second transfer line 1620 and applied to the switching transistor T2.

The vertical connection line 1820 may approximately extend in the second direction (e.g., the y-axis direction). The vertical connection line 1820 may be a portion of the bridge line BL described below with reference to FIG. 13 depending on the position of a pixel.

The driving voltage line 1830 may extend in the second direction (e.g., the y-axis direction). The driving voltage line 1830 may correspond to the driving voltage line PL of FIG. 2. The driving voltage line 1830 may be configured to apply the driving voltage ELVDD to the pixels. The driving voltage line 1830 may be electrically connected to the eighth transfer line 1760 through a contact hole 1830CNT to allow the driving voltage ELVDD to be transferred to the operation control transistor T5 and the capacitor upper electrode 1330 as described above. The driving voltage line 1830 of the first pixel circuit PC1 may be integrally formed as one body with the driving voltage line 1830 of the second pixel circuit PC2.

The tenth transfer line 1840 may be electrically connected to the ninth transfer line 1770 through a contact hole 1840CNT1 to receive the driving current from the first semiconductor layer 1100 or the second initialization voltage Vint2 from the fifth transfer line 1670 and the ninth transfer line 1770. In addition, the tenth transfer line 1840 may be configured to transfer the driving current or the second initialization voltage Vint2 to the first electrode (e.g., a pixel electrode) of the organic light-emitting diode OLED through a contact hole 1840CNT2 formed in an insulating layer thereon, the driving current being from the first semiconductor layer 1100.

The third connection electrode layer 1800 may include at least one of a metal, an alloy, a conductive metal oxide, and a transparent conductive material. As an example, the third connection electrode layer 1800 may include at least one of silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), and indium zinc oxide (IZO). The third connection electrode layer 1800 may have a multi-layered structure. As an example, the third connection electrode layer 1800 may have a two-layered structure of Ti/Al or have a three-layered structure of Ti/Al/Ti.

A third planarization insulating layer 125 shown in FIG. 12 may cover the third connection electrode layer 1800 and may be arranged on the second planarization insulating layer 123. The third planarization insulating layer 125 may include an organic insulating material. As an example, the third planarization insulating layer 125 may include at least one of a photoresist, benzocyclobutene (BCB), polyimide, hexamethyldisiloxane (HMDSO), polymethylmethacrylate (PMMA) or polystyrene, polymer derivatives having a phenol-based group, an acryl-based polymer, an imide-based polymer, an aryl ether-based polymer, an amide-based polymer, a fluorine-based polymer, a p-xylene-based polymer, and a vinyl alcohol-based polymer, or any compound thereof.

As shown in FIG. 12, the organic light-emitting diode OLED may be arranged on the third planarization insulating layer 125. The organic light-emitting diode OLED may include a pixel electrode 210, an intermediate layer 220, and an opposite electrode 230, the intermediate layer 220 including an emission layer.

The pixel electrode 210 may be a (semi) light transmissive electrode or a reflective electrode. As an example, the pixel electrode 210 may include a reflective layer and a transparent or semi-transparent electrode layer on the reflective layer. The reflective layer may include at least one of Ag, Mg, Al, Pt, Pd, Au, Ni, Nd, Ir, Cr, and a compound thereof. The transparent or semi-transparent electrode layer may include at least one of indium tin oxide (ITO), indium zinc oxide (IZO), zinc oxide ($ZnO_x$), indium oxide ($In_2O_3$), indium gallium oxide (IGO), and aluminum zinc oxide (AZO). The zinc oxide ($ZnO_x$) may be ZnO or $ZnO_2$. As an example, the pixel electrode 210 may have a three-layered structure of ITO/Ag/ITO.

A pixel-defining layer 127 may be arranged on the third planarization insulating layer 125. The pixel-defining layer 127 may prevent an arc and the like from occurring at edges of the pixel electrode 210 by increasing a distance between the edges of the pixel electrode 210 and the opposite electrode 230 over the pixel electrode 210.

The pixel-defining layer 127 may include at least one organic insulating material among, for instance, polyimide, polyamide, an acrylic resin, benzocyclobutene, and a phenolic resin and may be formed by spin coating and/or the like.

At least a portion of the intermediate layer 220 of the organic light-emitting diode OLED may be arranged in an opening OP of the pixel-defining layer 127. An emission area EA of the organic light-emitting diode OLED may be defined by the opening OP.

The intermediate layer 220 may include an emission layer. The emission layer may include an organic material including a fluorescent and/or phosphorous material emitting red, green, blue, or white light, but embodiments are not limited thereto. The emission layer may include an organic material or a polymer material. A functional layer may be selectively further arranged under and on the emission layer, the functional layer including at least one of a hole transport layer (HTL), a hole injection layer (HIL), an electron transport layer (ETL), and an electron injection layer (EIL).

The emission layer may have a shape patterned to correspond to each of the pixel electrodes 210. Layers other than the emission layer included in the intermediate layer 220 may be single bodies over the plurality of pixel electrodes 210. However, various modifications may be made.

The opposite electrode 230 may be a light transmissive electrode or a reflective electrode. As an example, the opposite electrode 230 may be a transparent or semi-transparent electrode and may include at least one of lithium (Li), calcium (Ca), lithium fluoride (LiF), aluminum (Al), silver (Ag), magnesium (Mg), and any compound thereof. In addition, the opposite electrode 230 may further include a transparent conductive oxide (TCO) layer including at least one of ITO, IZO, ZnO, and $In_2O_3$ on a metal thin layer. The opposite electrode 230 may be integrally formed as one body over the display area DA entirely and arranged on the intermediate layer 220 and the pixel-defining layer 127.

The organic light-emitting diode OLED may be covered by a thin-film encapsulation layer or an encapsulation substrate. In an embodiment, the thin-film encapsulation layer may include at least one inorganic encapsulation layer and at least one organic encapsulation layer. As an example, the thin-film encapsulation layer may include a first inorganic encapsulation layer, a second inorganic encapsulation layer, and an organic encapsulation layer therebetween.

The first inorganic encapsulation layer and the second inorganic encapsulation layer may each include at least one inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$) and may be formed by chemical vapor deposition (CVD). The organic encapsulation layer may include a polymer-based material. The polymer-based material may include at least one of a silicon-based resin, an acryl-based resin (e.g., polymethylmethacrylate, polyacrylic acid, and the like), an epoxy-based resin, polyimide, and polyethylene.

Each of the first inorganic encapsulation layer, the organic encapsulation layer, and the second inorganic encapsulation layer may be integrally formed as one body to cover the display area DA.

When needed or desired, a bottom metal layer may be arranged below the first pixel circuit PC1 and the second pixel circuit PC2. To protect the first pixel circuit PC1 and the second pixel circuit PC2, the bottom metal layer may be arranged between the first pixel circuit PC1 and the second pixel circuit PC2 and the substrate 100 to overlap the first pixel circuit PC1 and the second pixel circuit PC2. The bottom metal layer may prevent external light from reaching and influencing the first pixel circuit PC1 and the second pixel circuit PC2, or reduce the influence of external light.

Figure 13:
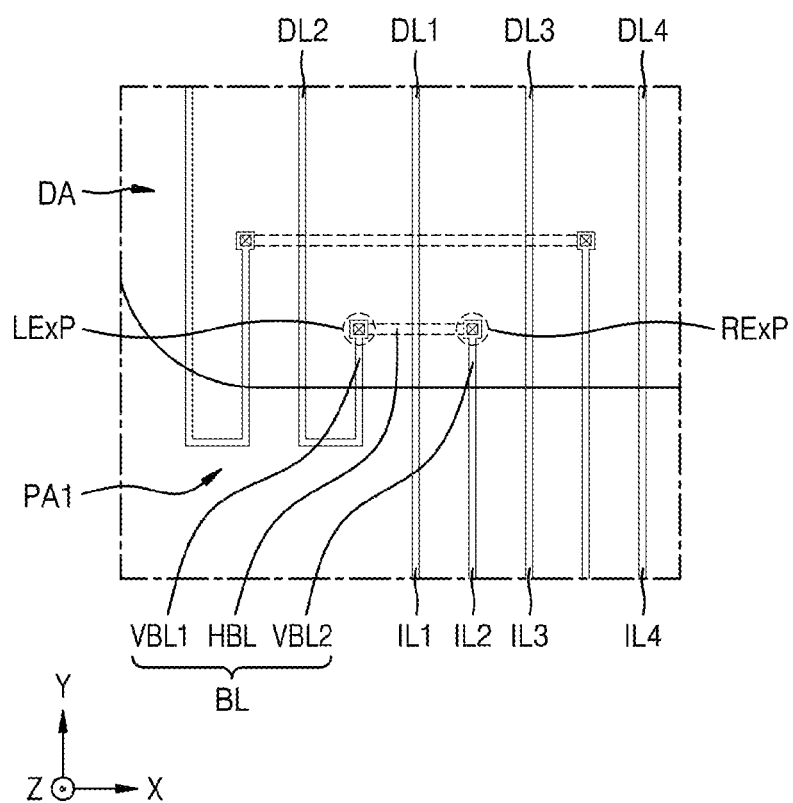
FIG. 13 is a schematic plan view of a portion of a display apparatus according to an embodiment.

FIG. 13 is a schematic plan view of a portion of a display apparatus according to an embodiment. FIG. 13 may correspond to a region A of FIG. 1.

As shown in FIG. 1, a width (in the x-axis direction) of a portion of the peripheral area PA in which a terminal part PAD is arranged may be less than a width (in the x-axis direction) of a portion including the display area DA and the peripheral area PA in the center of the display area DA. Accordingly, as shown in FIG. 13, in the lower left end of the display area DA, which is a region A of FIG. 1, a relationship of a data line and an input line connected to the data line may be different from a relationship of another data line and an input line connected to the other data line.

Each of the pixels in the display area DA may include a pixel circuit and a display element electrically connected to the pixel circuit. Some pixels may be electrically connected to the first data line DL1, and other pixels may be electrically connected to the second data line DL2. The first data line DL1 and the second data line DL2 may extend in the second direction (e.g., the y-axis direction) and cross the display area DA. The second data line DL2 is arranged in a first direction (e.g., a (−) x-direction) from the first data line DL1.

Both a first input line IL1 and a second input line IL2 apart from each other may be arranged in the peripheral area PA. For instance, the first input line IL1 and the second input line IL2 may be arranged in a first peripheral area PA1 of the peripheral area PA in which the terminal part PAD is arranged. The second input line IL2 may be arranged in the opposite direction of the first direction (e.g., the (−) x-direction) from the first input line IL1.

The first input line IL1 may be electrically connected to the first data line DL1. As an example, the first data line DL1 may be arranged on an insulating layer covering the first input line IL1 and electrically connected to the first input line IL1 through a contact hole formed in the insulating layer. Alternatively, the first data line DL1 and the first input line IL1 may be integrally formed as one body.

The second data line DL2 is electrically connected to the second input line IL2. In this case, the second data line DL2 is electrically connected to the second input line IL2 through a bridge line BL. For example, one end of the bridge line BL is electrically connected to the second data line DL2 in the peripheral area PA and crosses, on a different layer from the layer on which the first data line DL1 is disposed, the first data line DL1 through the display area DA, and another end is electrically connected to the second input line IL2 in the peripheral area PA. Alternatively, one end of the bridge line BL is electrically connected to the second data line DL2 in the display area DA and crosses, on the different layer from the layer on which the first data line DL1 is disposed, the first data line DL1 in the display area DA, and another end is electrically connected to the second input line IL2 in the peripheral area PA. Through this connection structure, as shown in FIG. 1, even when the width (in the x-axis direction) of the portion of the peripheral area PA in which the terminal part PAD is arranged is less than the width (in the x-axis direction) of the portion including the display area DA and the peripheral area PA in the center of the display area DA, each of the data lines may be electrically connected to a corresponding input line.

In the case where one end of the bridge line BL is electrically connected to the second data line DL2 in the peripheral area PA and crosses, on the different layer from the layer on which the first data line DL1 is disposed, the first data line DL1 through the display area DA, and another end is electrically connected to the second input line IL2 in the peripheral area PA, the bridge line BL may include a first bridge vertical connection line VBL1, a bridge horizontal connection line HBL, and a second bridge vertical connection line VBL2, as shown in FIG. 13.

The first bridge vertical connection line VBL1 extends in the second direction (e.g., the y-axis direction) and extends from the peripheral area PA into the display area DA. The bridge horizontal connection line HBL may be arranged in the display area DA, may extend in the first direction (e.g., the (−) x-axis direction), and cross, on a different layer from the layer on which the first data line DL1 is disposed, the first data line DL1. One end of the bridge horizontal connection line HBL may be electrically connected to the first bridge vertical connection line VBL1. The second bridge vertical connection line VBL2 is electrically connected to another end of the horizontal connection line HBL, extends in the second direction (e.g., the y-axis direction), and extends from the display area DA to the peripheral area PA. In this case, the first bridge vertical connection line VBL1 on one side (e.g., the (−) x-direction) of the bridge horizontal connection line HBL may be electrically connected to the second data line DL2, and the second bridge vertical connection line VBL2 on another side (e.g., the (+) x-direction) of the bridge horizontal connection line HBL may be electrically connected to the second input line IL2.

Unlike FIG. 13, one end of the bridge line BL may be electrically connected to the second data line DL2 in the display area DA, may cross, on a different layer from the layer on which the first data line DL1 is disposed, the first data line DL1 in the display area DA, and another end may be electrically connected to the second input line IL2 in the peripheral area PA. In this case, the bridge line BL may not include the first bridge vertical connection line VBL1 and may include the bridge horizontal connection line HBL and the second bridge vertical connection line VBL2. For example, the bridge horizontal connection line HBL may extend in the first direction (e.g., the (−) x-axis direction) and cross, on a different layer from the layer on which the first data line DL1 is disposed, the first data line DL1. One end of the bridge horizontal connection line HBL may be electrically connected to the second data line DL2. The second bridge vertical connection line VBL2 is electrically connected to another end of the bridge horizontal connection line HBL, extends in the second direction (e.g., the y-axis direction), and extend from the display area DA to the peripheral area PA. In addition, the second bridge vertical connection line VBL2 may be electrically connected to the second input line IL2.

Figure 14:
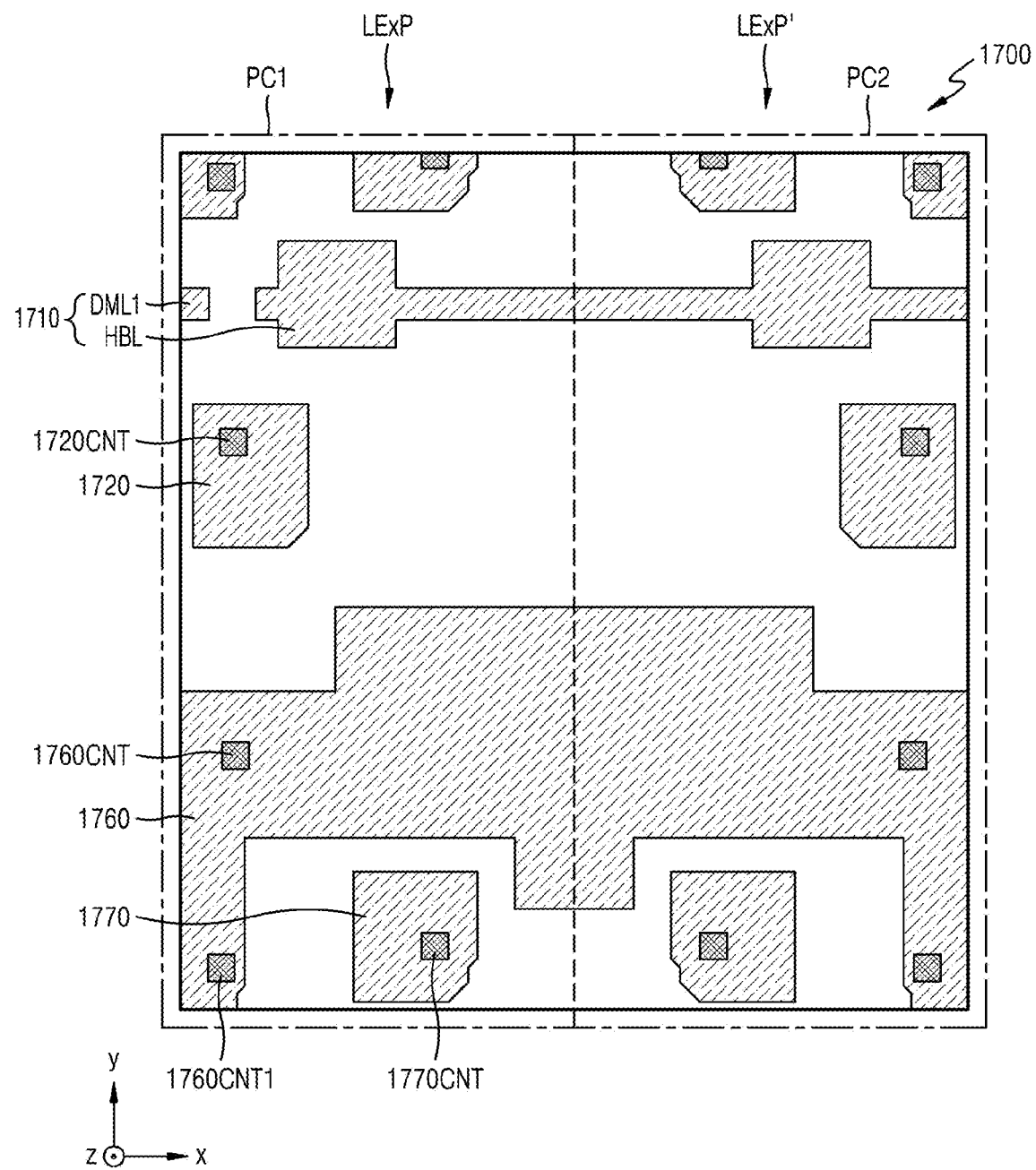
FIGS. 14 and 15 are schematic configuration views of elements of a pixel of the display apparatus shown in FIG. 13 according to some embodiments.
Figure 15:
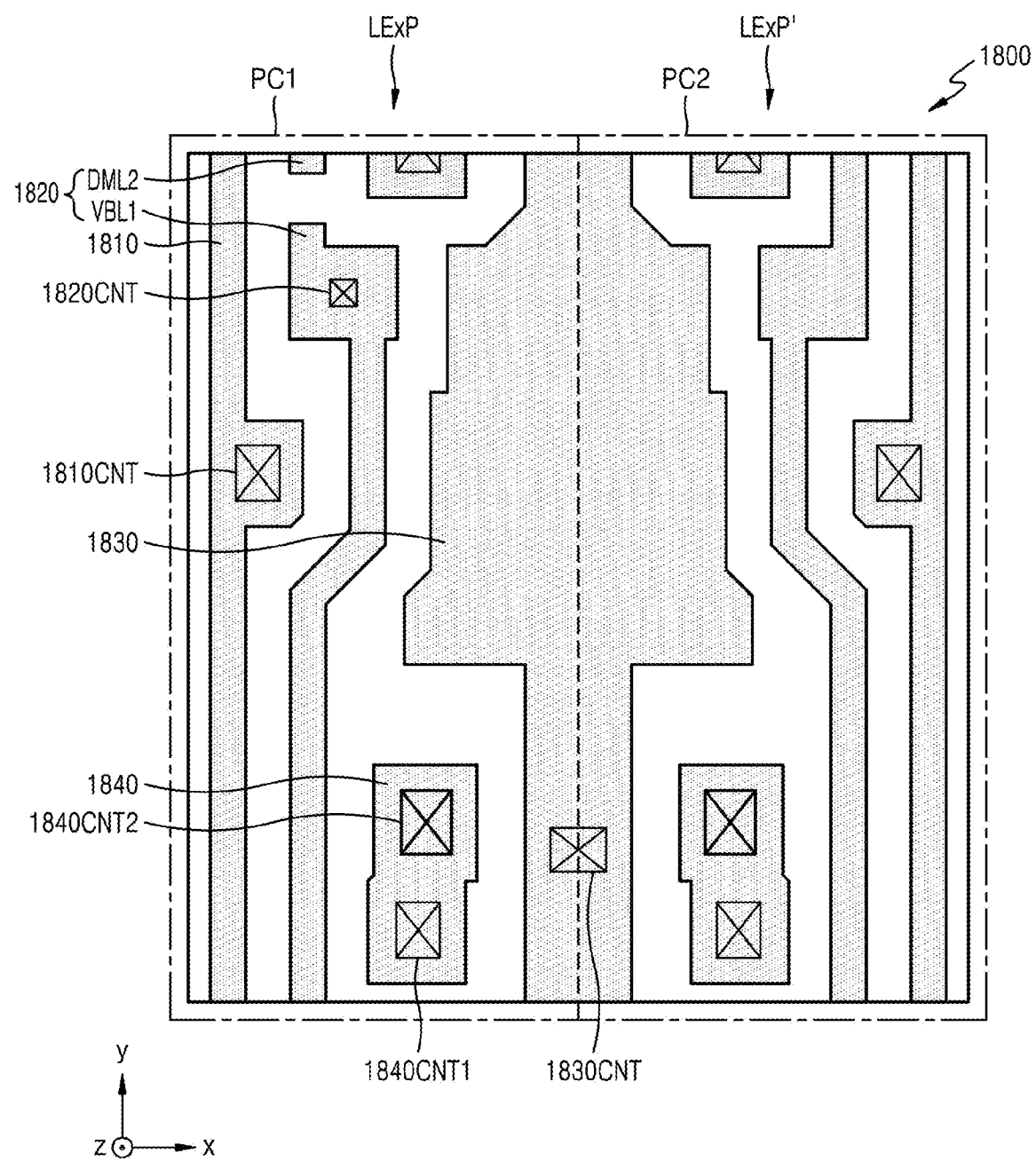

FIGS. 14 and 15 are schematic configuration views of elements of a pixel LExP arranged in a portion where the first bridge vertical connection line VBL1 is electrically connected to the bridge horizontal connection line HBL in FIG. 13 according to some embodiments. In FIGS. 14 and 15, for convenience of description, the pixel LExP and a pixel LExP' adjacent thereto are shown together.

As shown in FIG. 14, the horizontal connection line 1710 is cut in the pixel LExP. Accordingly, the horizontal connection line 1710 includes the bridge horizontal connection line HBL and a first dummy line DML1 apart from each other. Similarly, as shown in FIG. 15, the vertical connection line 1820 is cut in the pixel LExP. Accordingly, the vertical connection line 1820 includes the first bridge vertical connection line VBL1 and a second dummy line DML2 apart from each other. The first bridge vertical connection line VBL1 is electrically connected to the bridge horizontal connection line HBL through a contact hole 1820CNT formed in an insulating layer therebetween.

Figure 16:
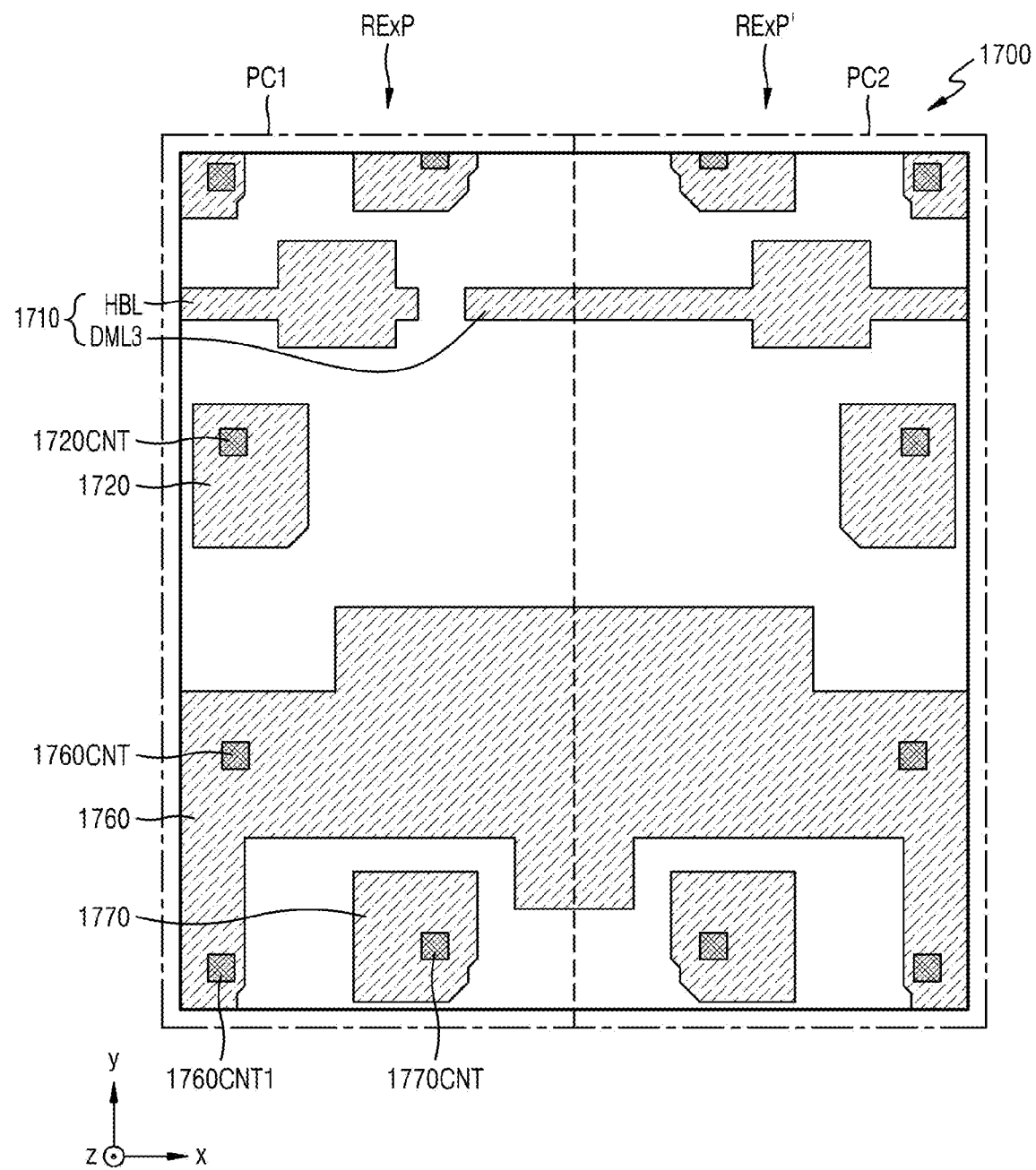
FIGS. 16 and 17 are schematic configuration views of elements of another pixel of the display apparatus shown in FIG. 13 according to some embodiments.
Figure 17:
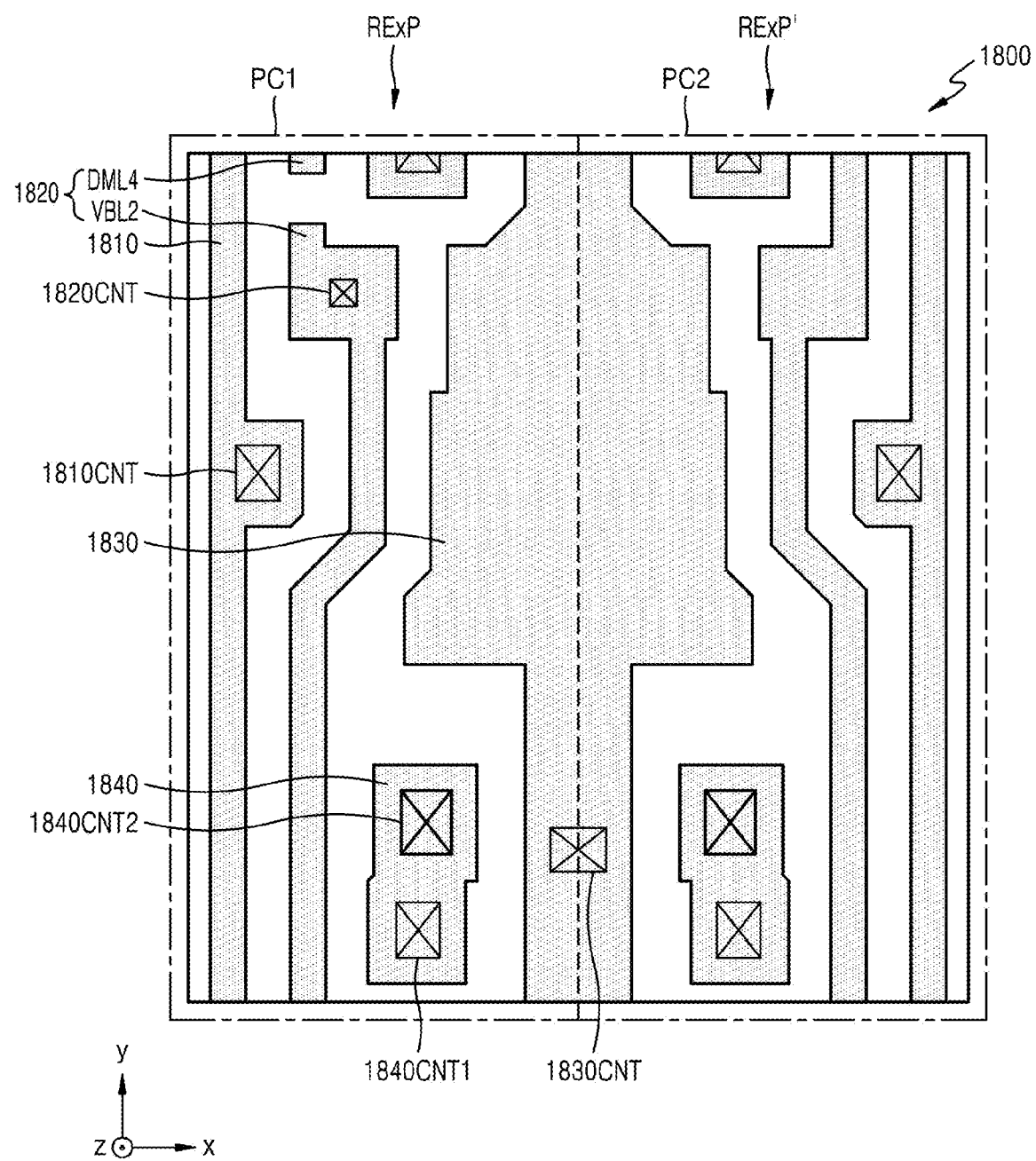

FIGS. 16 and 17 are schematic configuration views of elements of a pixelRExP arranged in a portion where the second bridge vertical connection line VBL2 is electrically connected to the bridge horizontal connection line HBL in FIG. 13 according to some embodiments. In FIGS. 16 and 17, for convenience of description, the pixel RExP and a pixel RExP' adjacent thereto are shown together.

As shown in FIG. 16, the horizontal connection line 1710 is cut in the pixel RExP. Accordingly, the horizontal connection line 1710 includes the bridge horizontal connection line HBL and a third dummy line DML3 apart from each other. Similarly, as shown in FIG. 17, the vertical connection line 1820 is cut in the pixel RExP. Accordingly, the vertical connection line 1820 includes the second bridge vertical connection line VBL2 and a fourth dummy line DML4 apart from each other. The second bridge vertical connection line VBL2 is electrically connected to the bridge horizontal connection line HBL through a contact hole 1820CNT formed in an insulating layer therebetween. As described above, depending on the position of a pixel in the display apparatus, the horizontal connection line 1710 may be disconnected or the vertical connection line 1820 may be disconnected in the pixel, and there may be the contact hole 1820CNT.

Figure 18:
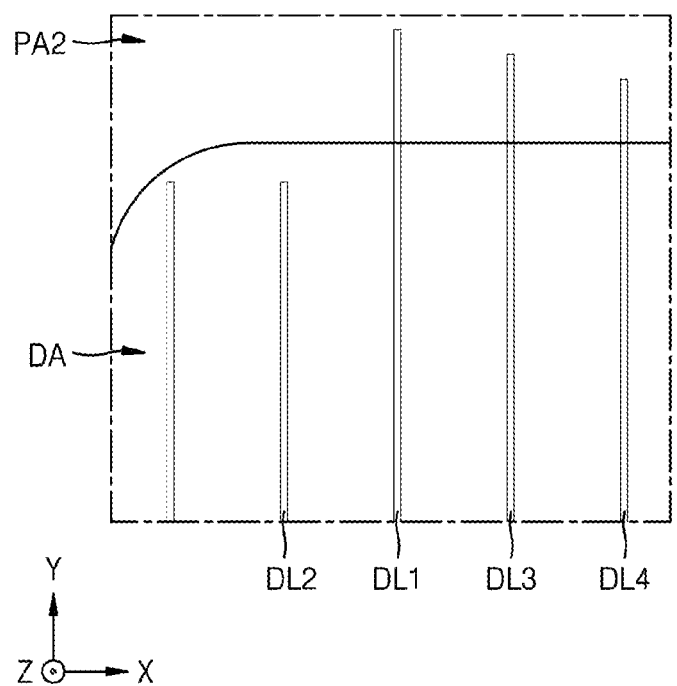
FIG. 18 is a schematic plan view of a portion of a display apparatus according to an embodiment.

FIG. 18 is a schematic plan view of a portion of a display apparatus according to an embodiment. FIG. 18 may correspond to a region B of FIG. 1. As shown in FIG. 18, the length of the first data line DL1 may be greater than the length of the second data line DL2.

As described above with reference to FIG. 13, the second data line DL2 is electrically connected to the second input line IL2 through the bridge line BL, and the first data line DL1 is directly electrically connected to the first input line IL1. When the length of the first data line DL1 is equal to the length of the second data line DL2, the entire length of the second data line DL2, the bridge line BL, and the second input line IL2 is greater than the entire length of the first data line DL1 and the first input line IL1. In this case, even when the same data signal is applied to the first input line IL1 and the second input line IL2, an emission degree of the pixels electrically connected to the first data line DL may be different from an emission degree of the pixels electrically connected to the second data line DL2.

In contrast, in the display apparatus according to an embodiment, the length of the first data line DL1 directly electrically connected to the first input line IL1 is greater than the length of the second data line DL2 electrically connected to the second input line IL2 through the bridge line BL. Accordingly, a sum of the length of the second data line DL2 and the length of the bridge line BL may be made substantially equal or similar to the length of the first data line DL1. As a result, the entire length of the second data line DL2, the bridge line BL, and the second input line IL2 may be made equal to or similar to the entire length of the first data line DL1 and the first input line IL1. Through this configuration, the display apparatus displaying high quality images may be implemented.

As described above, the first input line IL1 and the second input line IL2 may be arranged in the first peripheral area PA1 of the peripheral area PA, in which the terminal part PAD is arranged, the first peripheral area PA1 being one side of the display area DA. To make the length of the first data line DL1 greater than the length of the second data line DL2, an extended portion of the first data line DL1 may be arranged in the peripheral area PA. Because the terminal part PAD is arranged in the first peripheral area PA1, there may not be sufficient space in the first peripheral area PA1 for the extended portion of the first data line DL1 to be arranged. Accordingly, the length of the first data line DL1 may be sufficiently extended by extending the first data line DL1 into a second peripheral area PA2.

It is shown in FIG. 18 that only the first data line DL1 extends into the second peripheral area PA2, the second data line DL2 electrically connected to the bridge line BL does not extend into the second peripheral area PA2, and an end portion of the second data line DL2 is arranged in the display area DA. However, embodiments are not limited thereto. As an example, each of the first data line DL1 and the second data line DL2 may extend into the second peripheral area PA2 on another side of the display area DA. In this case, the length of the first data line DL1 in the second peripheral area PA2 may be made greater than the length of the second data line DL2 in the second peripheral area PA2.

As shown in FIG. 13, the third data line DL3 may be disposed over the substrate to be arranged in the opposite direction of the first direction (e.g., the (−) x-direction) from the first data line DL1. The third data line DL3 may cross the display area DA. In addition, a third input line IL3 may be arranged in the first peripheral area PA1. The third input line IL3 is arranged in the opposite direction of the first direction (e.g., the (−) x-direction) from the second input line IL2. Accordingly, the second input line IL2 may be arranged between the first input line IL1 and the third input line IL3. In addition, the third data line DL3 may be directly electrically connected to the third input line IL3. The way in which the third data line DL3 is connected to the third input line IL3 may be equal or similar to the way in which the first data line DL1 is connected to the first input line IL1.

Because, like the first data line DL1 is electrically connected to the first input line IL1 without passing through the bridge line BL, the third data line DL3 is electrically connected to the third input line IL3 without passing through the bridge line BL, the third data line DL3, similar to the first data line DL1, may extend into the second peripheral area PA2 on another side of the display area DA as shown in FIG. 18.

Likewise, as shown in FIG. 13, the fourth data line DL4 may be disposed over the substrate to be arranged in the opposite direction of the first direction (e.g., the (−) x-direction) from the third data line DL3. The fourth data line DL4 may also cross the display area DA. In addition, a fourth input line IL4 may be arranged in the first peripheral area PA1. The fourth input line IL4 is arranged in the opposite direction of the first direction (e.g., the (−) x-direction) from the third input line IL3. Accordingly, the third input line IL3 may be arranged between the second input line IL2 and the fourth input line IL4. In addition, the fourth data line DL4 may be directly electrically connected to the fourth input line IL4. The way in which the fourth data line DL4 is connected to the fourth input line IL4 may be equal or similar to the way in which the first data line DL1 is connected to the first input line IL1.

Because, like the first data line DL1 is electrically connected to the first input line IL1 without passing through the bridge line BL, the fourth data line DL4 is electrically connected to the fourth input line IL4 without passing through the bridge line BL, the fourth data line DL4, similar to the first data line DL1, may extend into the second peripheral area PA2 on another side of the display area DA as shown in FIG. 18.

Figure 19:
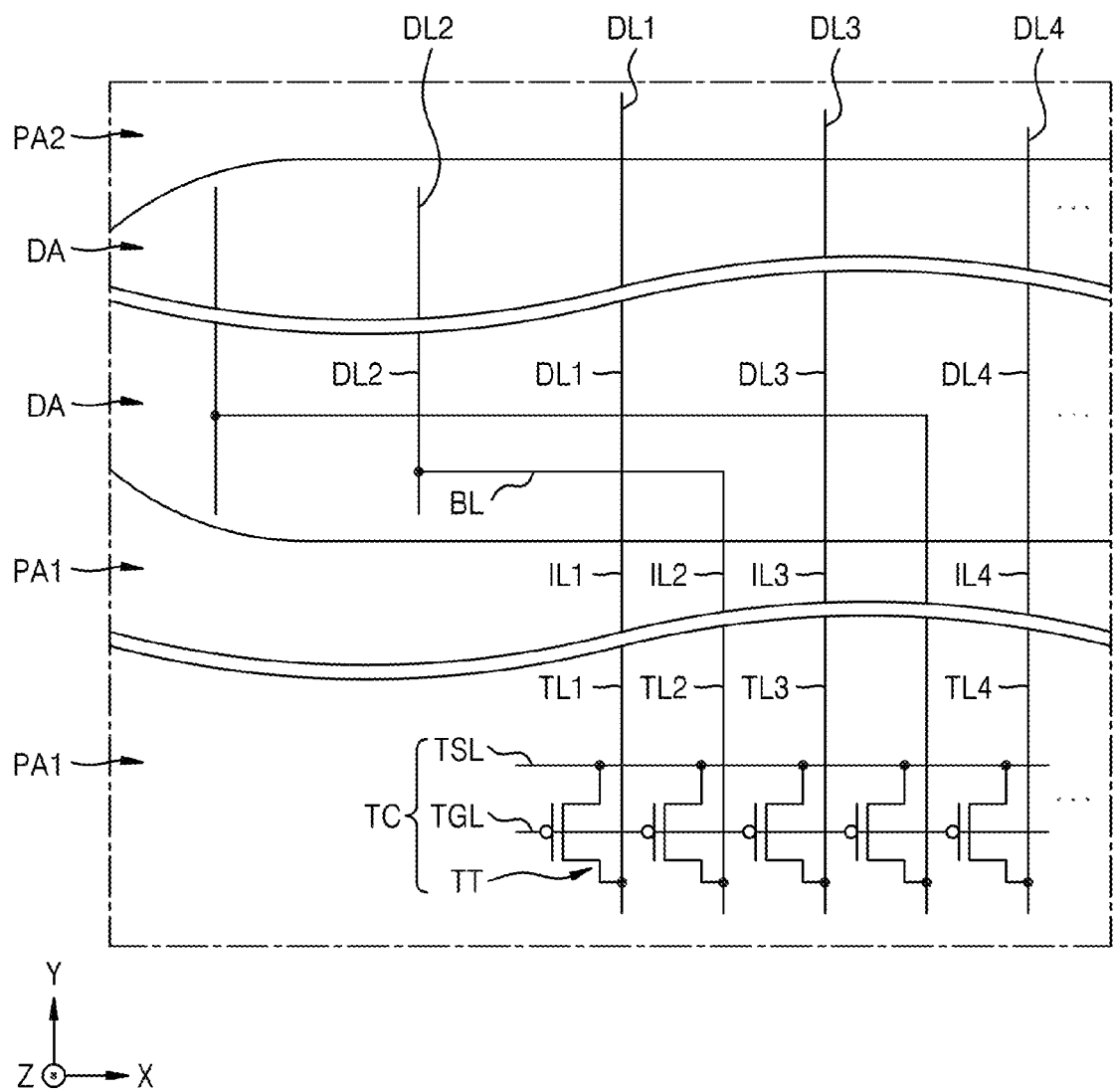
FIG. 19 is a schematic conceptual view of a connection relationship between a test circuit and some data lines of a display apparatus according to an embodiment.

FIG. 19 is a schematic conceptual view of a connection relationship between a test circuit TC and the data lines, e.g., the first to fourth data lines DL1, DL2, DL3, and DL4, of a display apparatus according to an embodiment.

As shown in FIG. 19, gate electrodes of test thin-film transistors TT are electrically connected to each other by a test gate line TGL. Accordingly, when an electric signal is applied to the test gate line TGL, the test thin-film transistors TT are simultaneously turned on. Accordingly, electric signals from the test signal line TSL are transferred to the data lines, e.g., the first to fourth data lines DL1, DL2, DL3, and DL4, through first to fourth test lines TL1, TL2, TL3, and TL4 and the input lines, e.g., the first to fourth input lines IL1, IL2, IL3, and IL4 connected thereto. Accordingly, because the pixels in the display area DA electrically connected to the data lines, e.g., the first to fourth data lines DL1, DL2, DL3, and DL4, emit light, whether the pixels in the display area DA are defective may be tested.

Although it is shown in FIG. 19 that there is one test signal line TSL, embodiments are not limited thereto. As an example, there may be a first test signal line and a second test signal line, some of the data lines may be electrically connected to the first test signal line through the test thin-film transistor TT, and the others of the data lines may be electrically connected to the second test signal line through the test thin-film transistor TT.

As described above, the first data line DL1, the third data line DL3, and the fourth data line DL4 are directly electrically connected to the corresponding input lines without passing through the bridge line BL. The first data line DL1, the third data line DL3, and the fourth data line DL4 are sequentially arranged in the opposite direction of the first direction (e.g., the (−) x-axis direction). Accordingly, the length of the test signal line TSL through which a test signal applied to the fourth data line DL4 passes is greater than the length of the test signal line TSL through which a test signal applied to the third data line DL3 passes. The length of the test signal line TSL through which a test signal applied to the third data line DL3 passes is greater than the length of the test signal line TSL through which a test signal applied to the first data line DL1 passes.

Because there is a difference in the length of the test signal line TSL through which test signals pass before the test signals are applied to the data lines, when the lengths of the first data line DL1, the third data line DL3, and the fourth data line DL4 are the same, even though the first data line DL1, the third data line DL3, and the fourth data line DL4 are electrically connected to the same test signal line TSL, different test signals may be applied to the first data line DL1, the third data line DL3, and the fourth data line DL4, respectively.

In some embodiments, the length of the first data line DL1 in the second peripheral area PA2 is greater than the length of the third data line DL3 in the second peripheral area PA2. The length of the third data line DL3 in the second peripheral area PA2 is greater than the length of the fourth data line DL4 in the second peripheral area PA2. Through this configuration, testing whether the pixels in the display area DA are defective may be accurately performed, the testing being performed during a process of manufacturing a display apparatus.

It is shown in FIG. 19 that the second data line DL2 electrically connected to the bridge line BL does not extend into the second peripheral area PA2 and the end portion of the second data line DL2 is arranged in the display area DA. However, embodiments are not limited thereto. As an example, each of the first data line DL1, the second data line DL2, the third data line DL3, and the fourth data line DL4 may extend into the second peripheral area PA2 on another side of the display area DA. In this case, the length of each of the first data line DL1, the third data line DL3, and the fourth data line DL4 in the second peripheral area PA2 may be made greater than the length of the second data line DL2 in the second peripheral area PA2. Even in this case, the length of the first data line DL1 in the second peripheral area PA2 may be made greater than the length of the third data line DL3 in the second peripheral area PA2. And the length of the third data line DL3 in the second peripheral area PA2 may be made greater than the length of the fourth data line DL4 in the second peripheral area PA2.

Figure 20:
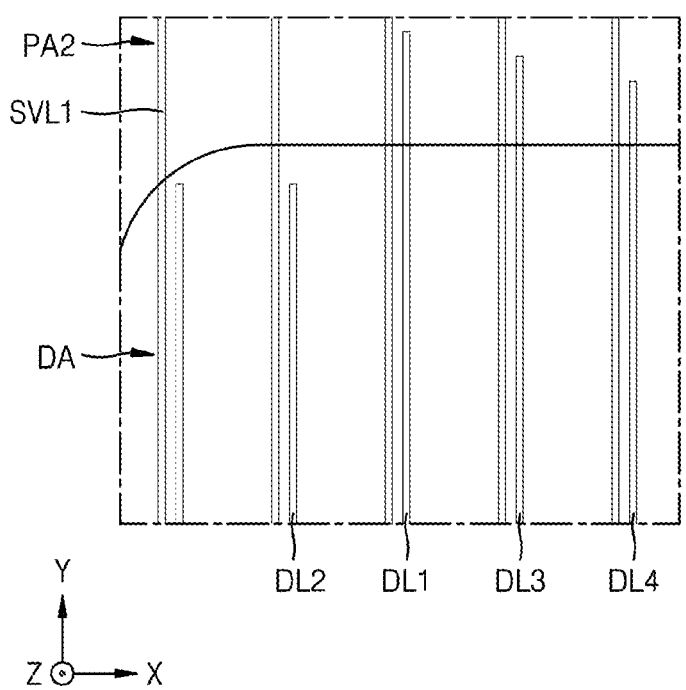
FIG. 20 is a schematic plan view of a portion of a display apparatus according to an embodiment.

FIG. 20 is a schematic plan view of a portion of a display apparatus according to an embodiment. As shown in FIG. 20, the display apparatus according to an embodiment includes first constant voltage lines SVL1 extending in the second direction (e.g., the y-axis direction) to respectively correspond to the first data line DL1, the second data line DL2, the third data line DL3, and the fourth data line DL4. The first constant voltage line SVL1 may be, for example, the driving voltage line 1830 described above with reference to FIG. 11.

The second data line DL2 is electrically connected to the bridge line BL as described above. The bridge line BL crosses, on a different layer from the layer on which the first data line DL1 is disposed, the first data line DL1. Accordingly, there is a parasitic capacitance between the bridge line BL and the first data line DL1. Consequently, this may be understood as a parasitic capacitance existing in the second data line DL2. For instance, unlike the first data line DL1, there is a parasitic capacitance in the second data line DL2 due to the bridge line BL.

In contrast, in the display apparatus according to some embodiments, as described above, the first data line DL1, the third data line DL3, and the fourth data line DL4 are not connected to the bridge line BL and extend into the second peripheral area PA2. When the second data line DL2 extends into the second peripheral area PA2, the length of each of the first data line DL1, the third data line DL3, and the fourth data line DL4 in the second peripheral area PA2 is greater than the length of the second data line DL2 in the second peripheral area PA2. Accordingly, a parasitic capacitance between each of the first data line DL1, the third data line DL3, and the fourth data line DL4 and the driving voltage line 1830 adjacent thereto becomes greater than a parasitic capacitance between the second data line DL2 and the driving voltage line 1830 adjacent thereto. Accordingly, a parasitic capacitance difference in the data lines may be reduced.

For reference, although the first constant voltage line SVL1 may be the driving voltage line 1830 described above with reference to FIG. 11, embodiments are not limited thereto. As an example, in the case where the display element is the organic light-emitting diode OLED, because an electrode power source, which is a constant voltage also called as a voltage ELVSS, is also electrically connected to the opposite electrode 230, the first constant voltage line SLV1 may be a line connected to the common voltage supply line 13 applying the electrode power source.

Figure 21:
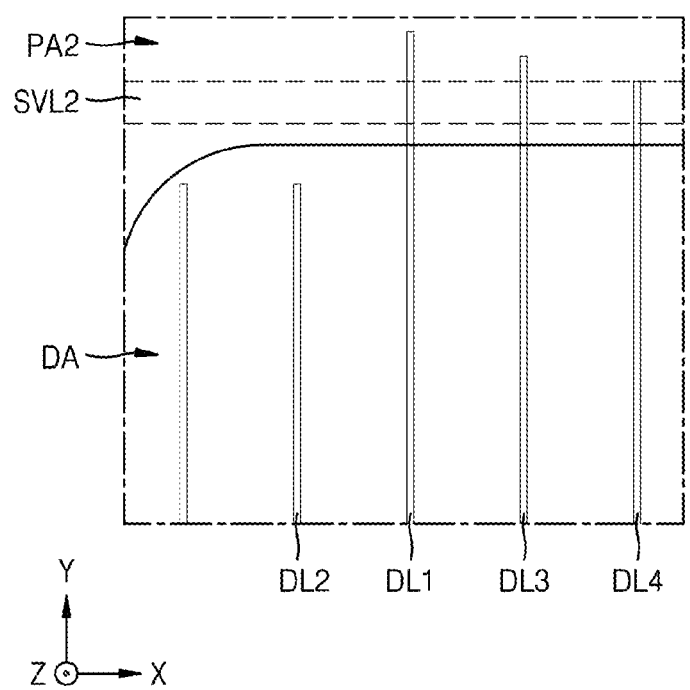
FIG. 21 is a schematic plan view of a portion of a display apparatus according to an embodiment.

FIG. 21 is a schematic plan view of a portion of a display apparatus according to an embodiment. The display apparatus according to an embodiment includes a second constant voltage line SVL2 arranged in the second peripheral area PA2 and to which a constant voltage is applied. The second constant voltage line SVL2 may be, for example, the common voltage supply line 13 shown in FIG. 1. For example, the second constant voltage line SVL2 may be electrically connected to the opposite electrode 230, which is integrally formed as one body over the display area DA. Alternatively, the second constant voltage line SVL2 may be a voltage line to which the driving voltage line 1830 described above with reference to FIG. 11 is electrically connected, the second constant voltage line SVL2 being in the second peripheral area PA2.

The second data line DL2 is electrically connected to the bridge line BL as described above, and the bridge line BL crosses, on a different layer from the layer on which the first data line DL1 is disposed, the first data line DL1. Accordingly, there is a parasitic capacitance between the bridge line BL and the first data line DL1. Consequently, this may be understood as a parasitic capacitance existing in the second data line DL2. For instance, unlike the first data line DL1, there is a parasitic capacitance in the second data line DL2 due to the bridge line BL, the second data line DL2 being connected to the bridge line BL.

In contrast, in the display apparatus according to some embodiments, the first data line DL1, the third data line DL3, and the fourth data line DL4 not connected to the bridge line BL may extend into the second peripheral area PA2 and overlap, on a different layer from the layer on which the second constant voltage line SVL2 is disposed, the second constant voltage line SVL2. Accordingly, there may be a parasitic capacitance in the first data line DL1, the third data line DL3, and the fourth data line DL4. Accordingly, a parasitic capacitance difference in the data lines may be reduced.

Figure 22:
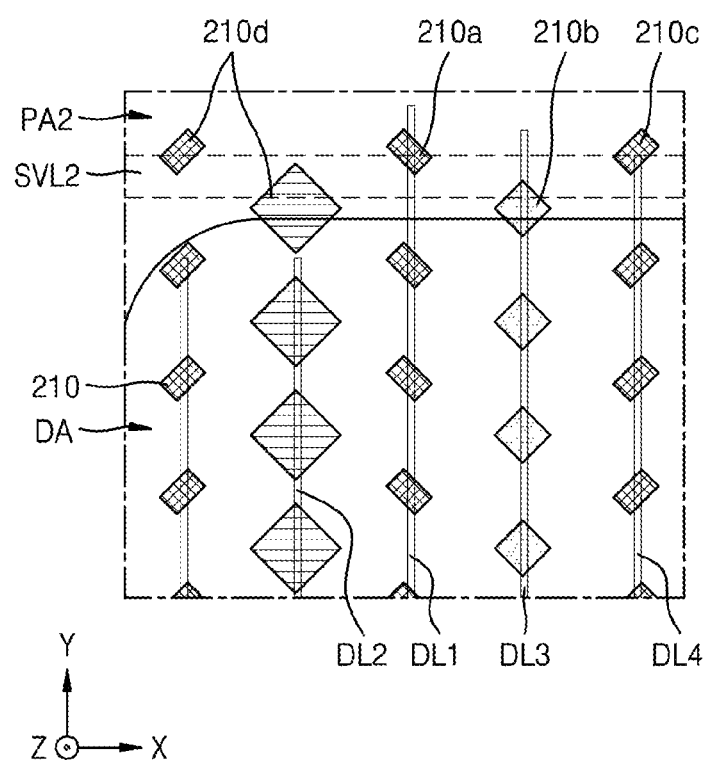
FIG. 22 is a schematic plan view of a portion of a display apparatus according to an embodiment.

FIG. 22 is a schematic plan view of a portion of a display apparatus according to an embodiment. The display apparatus according to some embodiments includes dummy pixel electrodes 210a, 210b, and 210c including the same material as that of the pixel electrode 210 arranged in the display area DA. The dummy pixel electrodes 210a, 210b, and 210c may include the same material as that of the pixel electrode 210 and be simultaneously formed.

The dummy pixel electrode 210a overlaps, on a different layer from the layer on which the first data line DL1 is disposed, the first data line DL1. The dummy pixel electrode 210b overlaps, on the different layer from the layer on which the third data line DL3 is disposed, the third data line DL3. The dummy pixel electrode 210c overlaps, on the different layer from the layer on which the fourth data line DL4 is disposed, the fourth data line DL4. As described above, because the dummy pixel electrodes 210a, 210b, and 210c overlap, on a different layer from the layer on which data lines not connected to the bridge line BL are disposed, data lines not connected to the bridge line BL, the data lines not connected to the bridge line BL may have a parasitic capacitance. Accordingly, a parasitic capacitance difference in the second data line DL2 connected to the bridge line BL and the data lines, e.g., the first, third, and fourth data lines DL1, DL3, and DL4 not connected to the bridge line BL, may be reduced.

For reference, although the dummy pixel electrodes 210a, 210b, and 210c may be arranged in the second peripheral area PA2, the entire region of each of the dummy pixel electrodes 210a, 210b, and 210c may not be arranged in the second peripheral area PA2. As an example, the dummy pixel electrode 210b may be over the display area DA and the second peripheral area PA2. In addition, a dummy pixel electrode 210d may be arranged in the second peripheral area PA2 while not overlapping the data line.

Figure 23:
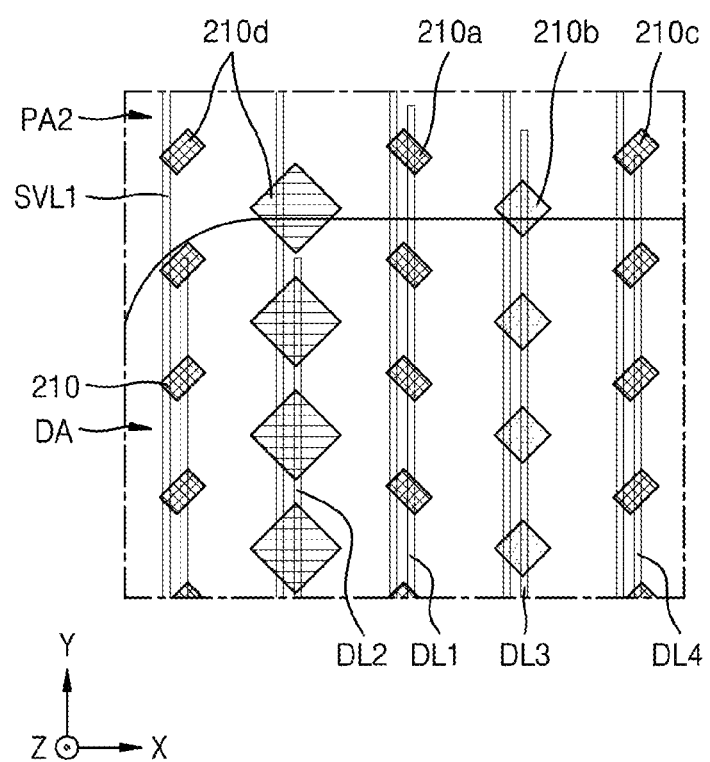
FIG. 23 is a schematic plan view of a portion of a display apparatus according to an embodiment.

The second constant voltage line SVL2 arranged in the second peripheral area PA2 and to which a constant voltage is applied may be electrically connected to the dummy pixel electrodes 210a, 210b, and 210c through contact holes. However, embodiments are not limited thereto. As an example, as shown in FIG. 23, which is a plan view of a portion of the display apparatus according to an embodiment, the first constant voltage line SVL1 crossing the display area DA may be electrically connected to the dummy pixel electrodes 210a, 210b, and 210c through contact holes. As described above, the first constant voltage line SVL1 may be the driving voltage line 1830 described above with reference to FIG. 11, or a line connected to the common voltage supply line 13 applying the electrode power to the opposite electrode 230, the electrode power being a constant voltage.

According to various embodiments, the display apparatus that may display high-quality images may be implemented, but the scope of the disclosure is not limited by this effect.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display apparatus comprising:
a substrate comprising a display area and a peripheral area outside the display area;
a first data line disposed over the substrate and crossing the display area;
a second data line disposed over the substrate and disposed in a first direction from the first data line, the second data line crossing the display area; and
a bridge line comprising one end electrically connected to the second data line and crossing, on a different layer from a layer on which the first data line is disposed, the first data line in the display area,
wherein a length of the first data line is greater than a length of the second data line.

2. The display apparatus of claim 1, further comprising:
a first input line disposed in a first peripheral area of the peripheral area, the first peripheral area being disposed on one side of the display area, the first input line being electrically connected to the first data line; and
a second input line disposed in the first peripheral area and disposed in a direction opposite the first direction from the first input line, the second input line being electrically connected to another end of the bridge line.

3. The display apparatus of claim 2, wherein the first data line extends into a second peripheral area of the peripheral area, the second peripheral area being disposed on another side of the display area.

4. The display apparatus of claim 2, wherein:
each of the first data line and the second data line extends into a second peripheral area of the peripheral area, the second peripheral area being disposed on another side of the display area; and
a length of the first data line in the second peripheral area is greater than a length of the second data line in the second peripheral area.

5. The display apparatus of claim 3, further comprising:
a constant voltage line disposed in the second peripheral area, the constant voltage line being configured to transmit a constant voltage,
wherein the first data line overlaps, on a different layer from a layer on which the constant voltage line is disposed, the constant voltage line.

6. The display apparatus of claim 5, wherein the constant voltage line is electrically connected to driving voltage lines configured to supply power to pixel circuits in the display area.

7. The display apparatus of claim 5, wherein the constant voltage line is electrically connected to an opposite electrode, which is integrally formed as one body over the display area.

8. The display apparatus of claim 3, further comprising:
a dummy pixel electrode disposed in the second peripheral area to overlap, on a different layer from the layer on which the first data line is disposed, the first data line, the dummy pixel electrode comprising a same material as that of a pixel electrode arranged in the display area.

9. The display apparatus of claim 8, further comprising:
a constant voltage line disposed in the second peripheral area, the constant voltage line being configured to transmit a constant voltage,
wherein the dummy pixel electrode is electrically connected to the constant voltage line.

10. The display apparatus of claim 9, wherein the constant voltage line is electrically connected to driving voltage lines configured to supply power to pixel circuits in the display area.

11. The display apparatus of claim 9, wherein the constant voltage line is electrically connected to an opposite electrode, which is integrally formed as one body over the display area.

12. The display apparatus of claim 2, further comprising:
a third data line disposed over the substrate and disposed in the direction opposite the first direction from the first data line, the third data line crossing the display area; and
a third input line disposed in the first peripheral area and positioned in the direction opposite the first direction from the second input line, the third input line being electrically connected to the third data line,
wherein the first data line and the third data line extend into a second peripheral area of the peripheral area, the second peripheral area being disposed on another side of the display area.

13. The display apparatus of claim 2, further comprising:
a third data line disposed over the substrate and disposed in the direction opposite the first direction from the first data line, the third data line crossing the display area; and
a third input line disposed in the first peripheral area and disposed in the direction opposite the first direction from the second input line, the third input line being electrically connected to the third data line, wherein each of the first data line, the second data line, and the third data line extends into a second peripheral area of the peripheral area, the second peripheral area being disposed on another side of the display area, and wherein a length of the first data line in the second peripheral area and a length of the third data line in the second peripheral area is greater than a length of the second data line in the second peripheral area.

14. The display apparatus of claim 12, wherein a length of the first data line in the second peripheral area is greater than a length of the third data line in the second peripheral area.

15. The display apparatus of claim 12, further comprising:
a constant voltage line disposed in the second peripheral area, the constant voltage line being configured to transmit a constant voltage,
wherein the first data line and the third data line overlap, on a different layer from a layer on which the constant voltage line is disposed, the constant voltage line.

16. The display apparatus of claim 15, wherein the constant voltage line is electrically connected to driving voltage lines configured to supply power to pixel circuits in the display area.

17. The display apparatus of claim 15, wherein the constant voltage line is electrically connected to an opposite electrode, which is integrally formed as one body over the display area.

18. The display apparatus of claim 12, further comprising:
dummy pixel electrodes disposed in the second peripheral area to overlap, on a different layer from a layer on which the first data line and the third data line are disposed, the first data line and the third data line, the dummy pixel electrodes comprising a same material as that of a pixel electrode disposed in the display area.

19. The display apparatus of claim 18, further comprising:
a constant voltage line disposed in the second peripheral area, the constant voltage line being configured to transmit a constant voltage,
wherein the dummy pixel electrodes are electrically connected to the constant voltage line.

20. The display apparatus of claim 19, wherein the constant voltage line is electrically connected to driving voltage lines configured to supply power to pixel circuits in the display area.

21. The display apparatus of claim 19, wherein the constant voltage line is electrically connected to an opposite electrode, which is integrally formed as one body over the display area.

22. The display apparatus of claim 1, wherein a sum of a length of the second data line and a length of the bridge line is equal to a length of the first data line.

* * * * *